(12) United States Patent
Hideki et al.

(10) Patent No.: US 7,462,900 B2
(45) Date of Patent: Dec. 9, 2008

(54) PHASE CHANGEABLE MEMORY DEVICES INCLUDING NITROGEN AND/OR SILICON

(75) Inventors: Horii Hideki, Seoul (KR); Bong-Jin Kuh, Gyeonggi-do (KR); Yong-Ho Ha, Gyeonggi-do (KR); Jeong-hee Park, Gyeonggi-do (KR); Ji-Hye Yi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/039,156

(22) Filed: Feb. 28, 2008

(65) Prior Publication Data

US 2008/0169457 A1    Jul. 17, 2008

Related U.S. Application Data

(60) Division of application No. 10/910,945, filed on Aug. 4, 2004, now Pat. No. 7,402,851, which is a continuation-in-part of application No. 10/781,597, filed on Feb. 18, 2004, now Pat. No. 7,115,927.

(30) Foreign Application Priority Data

Feb. 24, 2004  (KR) .................. 10-2004-0012358

(51) Int. Cl.
*H01L 27/108* (2006.01)
*H01L 29/76* (2006.01)
*H01L 29/94* (2006.01)
*H01L 31/119* (2006.01)
*H01L 27/10* (2006.01)
*H01L 29/73* (2006.01)
*H01L 29/74* (2006.01)
*H01L 27/148* (2006.01)
*H01L 29/768* (2006.01)
*H01L 29/00* (2006.01)
*H01L 23/48* (2006.01)
*H01L 23/52* (2006.01)

(52) U.S. Cl. ............. 257/300; 257/209; 257/211; 257/246; 257/247; 257/248; 257/249; 257/529; 257/758; 257/759; 257/760; 257/904

(58) Field of Classification Search ............ 257/209, 257/211, 246–249, 300, 529, 758–760, 904
See application file for complete search history.

(56) References Cited

U.S. PATENT DOCUMENTS 4,499,557 A    2/1985    Holmberg et al.

(Continued)

FOREIGN PATENT DOCUMENTS

JP    01-220236 A    9/1989

(Continued)

OTHER PUBLICATIONS

Decision to Grant Patent for Korean Patent Application No. 10-2006-0045298; Oct. 15, 2007.

(Continued)

*Primary Examiner*—Ida M Soward
(74) *Attorney, Agent, or Firm*—Myers Bigel Sibley & Sajovec, P.A.

(57) ABSTRACT

Phase-changeable memory devices and method of fabricating phase-changeable memory devices are provided that include a phase-changeable material pattern of a phase-changeable material that may include nitrogen atoms and/or silicon atoms. First and second electrodes are electrically connected to the phase-changeable material pattern and provide an electrical signal thereto. The phase-changeable material pattern may have a polycrystal line structure.

22 Claims, 16 Drawing Sheets

U.S. PATENT DOCUMENTS

| | | | |
|---|---|---|---|
| 4,599,705 | A | 7/1986 | Holmberg et al. |
| 4,653,024 | A | 3/1987 | Young et al. |
| 4,719,594 | A | 1/1988 | Young et al. |
| 4,820,394 | A | 4/1989 | Young et al. |
| 4,845,533 | A | 7/1989 | Pryor et al. |
| 4,924,436 | A | 5/1990 | Strand |
| 5,124,232 | A | 6/1992 | Nakanishi et al. |
| 5,162,495 | A | 11/1992 | Chiang et al. |
| 5,166,758 | A | 11/1992 | Ovshinsky et al. |
| 5,278,011 | A | 1/1994 | Yamada et al. |
| 5,714,768 | A | 2/1998 | Ovshinsky et al. |
| 5,811,816 | A | 9/1998 | Gallagher et al. |
| 5,825,046 | A | 10/1998 | Czubatyj et al. |
| 6,087,674 | A | 7/2000 | Ovshinsky et al. |
| 6,258,062 | B1 | 7/2001 | Thielen et al. |
| 6,365,256 | B1 | 4/2002 | Tyan et al. |
| 6,381,967 | B1 | 5/2002 | Craig |
| 6,429,064 | B1 | 8/2002 | Wicker |
| 6,437,383 | B1 * | 8/2002 | Xu .................. 257/300 |
| 6,507,061 | B1 | 1/2003 | Hudgens et al. |
| 6,586,761 | B2 | 7/2003 | Lowrey |
| 6,588,540 | B2 | 7/2003 | Graber et al. |
| 6,593,176 | B2 * | 7/2003 | Dennison ............ 438/200 |
| 6,648,096 | B2 | 11/2003 | Berg et al. |
| 6,650,979 | B1 | 11/2003 | Kreft |
| 6,750,469 | B2 | 6/2004 | Ichihara et al. |
| 6,759,267 | B2 | 7/2004 | Chen |
| 6,774,388 | B2 | 8/2004 | Hudgens et al. |
| 6,791,102 | B2 | 9/2004 | Johnson et al. |
| 6,850,432 | B2 * | 2/2005 | Lu et al. ............ 365/163 |
| 6,856,002 | B2 | 2/2005 | Moore et al. |
| 6,858,277 | B1 | 2/2005 | Yamada et al. |
| 6,859,389 | B2 | 2/2005 | Idehara |
| 6,859,535 | B1 | 2/2005 | Tatebayashi |
| 6,864,503 | B2 | 3/2005 | Lung |
| 6,867,425 | B2 | 3/2005 | Wicker |
| 6,884,991 | B2 | 4/2005 | Durocher |
| 6,899,938 | B2 | 5/2005 | Flynn |
| 6,919,578 | B2 | 7/2005 | Lowrey et al. |
| 7,037,762 | B2 | 5/2006 | Joo et al. |
| 7,049,623 | B2 | 5/2006 | Lowrey |
| 7,088,670 | B2 | 8/2006 | Kondo |
| 7,115,927 | B2 | 10/2006 | Hideki et al. |
| 7,187,373 | B2 | 3/2007 | Tobita |
| 7,205,562 | B2 | 4/2007 | Wicker |
| 7,292,521 | B2 | 11/2007 | Ovshinsky et al. |
| 2002/0072010 | A1 | 6/2002 | Kubogata |
| 2002/0081804 | A1 | 6/2002 | Gill et al. |
| 2002/0160553 | A1 | 10/2002 | Yamanaka et al. |
| 2003/0047762 | A1 | 3/2003 | Lowrey |
| 2003/0067013 | A1 | 4/2003 | Ichihara et al. |
| 2003/0080427 | A1 | 5/2003 | Hudgens et al. |
| 2003/0122170 | A1 | 7/2003 | Apodaca et al. |
| 2003/0151041 | A1 | 8/2003 | Chiang |
| 2003/0165111 | A1 | 9/2003 | Flynn |
| 2003/0186504 | A1 | 10/2003 | Li et al. |
| 2004/0012009 | A1 | 1/2004 | Casagrande et al. |
| 2004/0106065 | A1 | 6/2004 | Miyamoto et al. |
| 2004/0114317 | A1 | 6/2004 | Chiang et al. |
| 2004/0115945 | A1 | 6/2004 | Lowrey et al. |
| 2004/0191683 | A1 | 9/2004 | Nishihara et al. |
| 2004/0192006 | A1 | 9/2004 | Campbell et al. |
| 2004/0248339 | A1 | 12/2004 | Lung |
| 2005/0002227 | A1 | 1/2005 | Hideki et al. |
| 2005/0030800 | A1 | 2/2005 | Johnson et al. |
| 2005/0064334 | A1 | 3/2005 | Hirotsune et al. |
| 2005/0115828 | A1 | 6/2005 | Yahagi et al. |
| 2005/0115829 | A1 * | 6/2005 | Yahagi et al. .......... 204/298.13 |
| 2005/0227035 | A1 | 10/2005 | Fuchioka et al. |
| 2007/0221906 | A1 | 9/2007 | Hideki et al. |

FOREIGN PATENT DOCUMENTS

| | | |
|---|---|---|
| JP | 10340489 A | 12/1998 |
| JP | 2002-203392 | 7/2002 |
| KR | 2000-0052840 A | 8/2000 |
| KR | 20010006496 A | 1/2001 |
| KR | 1020010111276 | 12/2001 |
| KR | 1020020059162 A | 7/2002 |
| KR | 10-2004-0078646 A | 9/2004 |
| KR | 1020040078464 A | 9/2004 |
| KR | 2001-0111276 A | 2/2005 |
| WO | WO 98/19350 A1 | 5/1998 |
| WO | WO 98/47142 | 10/1998 |
| WO | WO 00/54982 A1 | 9/2000 |
| WO | WO 03/020998 A2 | 3/2003 |
| WO | WO 2004/034368 A1 | 4/2004 |

OTHER PUBLICATIONS

English Translation of Decision to Grant Patent for Korean Patent Application No. 10-2006-0045298; Oct. 15, 2007.

Notice to File Response/Amendment to the Examination Report, Korean App. No. 10-2004-0012358, Dec. 21, 2005.

Notice to File a Response/Amendment to the Examination Report corresponding to Korean Patent Application No. 10-2004-12358 mailed Dec. 21, 2005.

Abstract of Korean Patent Application No. 1020014011708 corresponding to 1020010111276.

Notice to File a Response/Amendment to the Examination Report corresponding to Korean Patent Application No. 10-2004-0012358 mailed May 24, 2006.

* cited by examiner

PHASE CHANGEABLE MEMORY DEVICES INCLUDING NITROGEN AND/OR SILICON

CLAIM OF PRIORITY

The present application is a divisional of and claims priority from U.S. patent application Ser. No. 10/910,945, filed Aug. 4, 2004 now U.S. Pat. No. 7,402,851. U. S. patent application Ser. No. 10/910,945 is a continuation-in-part of and claims priority from U. S. Pat. application Ser. No. 10/781,597, filed Feb. 18, 2004 (now U.S. Pat. No. 7,115,927), which claims priority from Korean Patent Application No. 2003-11416, filed on Feb. 24, 2003, in the Korean Intellectual Property Office, the disclosures of which are incorporated herein by reference in their entireties. The present application also claims priority under 35 U.S.C. §119 from Korean Patent Application No. 2004-12358, filed on Feb. 24, 2004, in the Korean Intellectual Property Office, the disclosure of which is incorporated herein by reference in its entirety.

FIELD OF THE INVENTION

The present invention relates to semiconductor memory devices and more specifically to phase-changeable memory devices and methods of fabricating the same.

BACKGROUND OF THE INVENTION

Semiconductor memory devices are typically categorized into volatile memory devices and non-volatile memory devices depending on whether data can be conserved or not when power is removed from the device. Volatile memory devices include D-RAM devices and S-RAM devices and non-volatile memory devices include flash memory devices. These memory devices, typically, indicate logic "0" or "1" according to the presence of stored charge.

D-RAM (i.e. a volatile memory device) typically requires periodic refresh operations and a high capability for storing charges. Thus, there have been extensive studies on improving a capacitance of the DRAM device. For instance, increasing the surface area of capacitor electrodes may increase the capacitance but the surface area increase of the capacitor electrode may be an obstacle to improved device integrity.

Conventional flash memory cells typically include a gate insulating layer, a floating gate, a dielectric layer and a control gate that are sequentially stacked on the semiconductor substrate. Writing or erasing data into the flash memory cell typically employs tunneling electrons through a gate insulating layer. In this case, the operating voltage may need to be higher than a power supply voltage. Thus, the flash memory devices may need a booster circuit that applies the higher voltage to write or erase data.

Accordingly, new memory devices have been developed, having non-volatile, random access characteristics and a simple structure. Such devices include phase-changeable memory devices. The phase-changeable memory device typically utilizes a phase-changeable material that changes crystalline structure thereof depending on the provided heat. Conventionally, the phase-changeable material is a chalcogen compound including germanium (Ge), antimony (Sb) and tellurium (Te) (i.e., CST or Ge—Sb—Te). When current is applied to the phase-changeable material layer to heat the GST, the crystalline state of a predetermined portion of the GST changes depending on the provided amount and time of the current. The resistance varies according to the state of crystal, such that logical information can be determined by detecting the difference of the resistance. In this case, a crystalline state has low resistance and an amorphous state has high resistance.

If GST is heated up to a melting point (about 610° C.) by applying high current flux to the GST for a short time (1-10 ns) and cooled quickly in a short time (1 ns or less), the heated portion of the GST becomes amorphous (e.g. a reset state). If GST is heated up to maintain a crystalline temperature (about 450° C.) lower than the melting point temperature by applying relatively low current flux for a long time, e.g., about 30-50 ns, (a resistant heating) and cooled down, the heated portion of the GST becomes crystalline (e.g., a set state).

Because the GST formed by conventional thin film deposition has a greater grain size (about 100 nm grains or larger, substantially mono-crystalline state), GST has a very low resistivity (e.g., about 2 mΩcm). Thus, a large amount of current may be required to provide the heat to form the amorphous state. For instance, when 1 mA high current pulse is applied for about 50 ns, a temperature of the GST may only be raised to about 141° C. because the resistivity of the GST is low (about 2 mΩ).

In addition, memory devices may need to be capable of maintaining their operating characteristics in spite of repeated writing operations. That is, it may be desirable for the memory device to have stability in its thermal budget due to repeated write operations. In a conventional memory device, exceeding a thermal budget changes the characteristic of the GST layer to lower the crystallization temperature. Therefore, malfunction may occur in a read operation. For example, when a voltage for a read operation is applied, false logic information may be read because a crystalline state of the GST varies (e.g., the resistance changes).

SUMMARY OF THE INVENTION

Embodiments of the present invention provide phase-changeable memory devices and methods of fabricating phase-changeable memory devices that include a phase-changeable material pattern of a phase-changeable material that includes silicon atoms and/or nitrogen atoms. First and second electrodes are electrically connected to the phase-changeable material pattern and provide an electrical signal thereto. In certain embodiments of the present invention, the phase-changeable material pattern has a polycrystalline structure.

In some embodiments of the present invention, the phase-changeable material includes a chalcogen compound doped with nitrogen atoms of about 0.25% to about 25% of a total number of atoms of the doped composition.

In further embodiments of the present invention, the phase-changeable material includes a chalcogen compound doped with silicon atoms of about 0.1% to about 15% of a total number of atoms of the doped composition.

In still further embodiments of the present invention, the phase-changeable material is doped with silicon atoms of about 0.1% to about 15% and nitrogen atoms of about 0.1% to about 20% of a total number of atoms of the doped composition.

A representative chalcogen compound includes, for example, $Ge_{22}Sb_{22}Te_{56}$ having three ingredients of tellurium Te, antimony Sb and germanium Ge. In particular embodiments of the present invention, the tellurium Te has a concentration ranging from at least about 20% to about 80% of the total number of atoms in the composition. The antimony Sb has a concentration ranging from about 5% to 50% of the total number of atoms in the composition and the remainder is germanium Ge. That is, this configuration can be characterized as $Te_aSb_bGe_{100-(a+b)}$ ($20 \leq a \leq 80$ and $5 \leq b \leq 50$), where the subscripts are atomic percentages that total 100% of the constituent elements. References to Ge—Sb—Te as a chalcogen compound may have the above configuration if there is no mention of a different configuration.

The compound may include two, three, four, five or more ingredients including at least one chalcogen element. As used herein, a chalcogen element refers to an element in the same column as oxygen in the periodic table of elements. That is, the compound may include A and B in the ratio $A_xB_{100-x}$, wherein component A is at least one chalcogen, such as tellurium Te, selenium Se, sulfur S, and/or polonium Po, and component B is antimony Sb, arsenic As, germanium Ge, tin Sn, phosphate P, S silver Ag, oxygen O, indium In and/or bismuth Bi. For example, the compound may be Ge—Sb—Te, As—Sb—Te, As—Ge—Sb—Te, Sn—Sb—Te, In—Sn—Sb—Te, Ag—In—Sb—Te, 5A group element-Sb—Te, 6A group element-Sb—Te, 5A group element-Sb—Se, 6A group element-Sb—Se, etc.

Therefore, in certain embodiments of the present invention, the phase-changeable material doped with nitrogen may be characterized as $(A_xB_{100-x})_nN_{100-n}$ ($x \leq 80$ and $75 \leq n \leq 99.75$) where the subscripts are atomic percentages that total 100% of the constituent elements associated with the respective subscript. Thus, for example, the subscript x may be a percentage of the total atoms in the composition AB and the subscript n may be a percentage of the total atoms in the composition (AB)N. The chalcogen compound may, for example, include tellurium Te, germanium Ge, and antimony Sb. In this case, the phase-changeable material may be characterized as $(Te-Sb-Ge)_nN_{100-n}$ ($75 \leq n \leq 99.75$) and the configuration of the Te—Sb—Se may be the same as explained above. That is, the phase-changeable material according to certain embodiments of the present invention may be characterized as $(Te_aSb_bGe_{100-(a+b)})_nN_{100-n}$ ($20 \leq a \leq 80$, $5 \leq b \leq 50$ and $75 \leq n \leq 99.75$), where the subscripts are atomic percentages that total 100% of the constituent elements associated with the respective subscript.

In further embodiments of the present invention, the phase-changeable material doped with silicon may be characterized as $(A_xB_{100-x})_nSi_{100-n}$ ($x \leq 80$ and $85 \leq n \leq 99.9$) where the subscripts are atomic percentages that total 100% of the constituent elements associated with the respective subscript. For example, when the chalcogen compound includes tellurium Te, germanium Ge, antimony Sb, the phase-changeable material may be characterized as $(Te-Sb-Ge)_nSi_{100-n}$ ($85 \leq n \leq 99.9$) and the configuration of Te—Sb—Ge is the same as explained above. That is, the phase-changeable material may be characterized as $(Te_aSb_bGe_{100-(a+b)})_nSi_{100-n}$ ($20 \leq a \leq 80$, $5 \leq b \leq 50$, and $85 \leq n \leq 99.9$) where the subscripts are atomic percentages that total 100% of the constituent elements associated with the respective subscript.

In further embodiments of the present invention, the phase-changeable material doped with nitrogen and silicon may include $(A_xB_{100-x})_nSi_cN_{100-(n+c)}$ ($x \leq 80$, $65 \leq n \leq 99.8$, $80 \leq n+c \leq 99.9$, and $0.1 \leq c \leq 15$ where the subscripts are atomic percentages that total 100% of the constituent elements associated with the respective subscript. In particular embodiments of the present invention, $x \leq 80$, $82 \leq n \leq 99.5$, $90 \leq n+c \leq 99.75$ and $0.25 \leq c \leq 8$. For example, if the chalcogen compound includes tellurium Te, antimony Sb and germanium Ge, the phase-changeable material layer may be characterized as $(Te-Sb-Ge)_nSi_cN_{100-(n+c)}$ ($0.1 \leq c \leq 15$, and $80 \leq c+n \leq 99.9$) and in particular embodiments, $0.25 \leq c \leq 8$, and $90 \leq c+n \leq 99.75$, and the configuration of the Te—Sb—Ge is the same as explained above. Namely, the phase-changeable material layer may be characterized as $(Te_aSb_bGe_{100-(a+b)})_nSi_cN_{100-(n+c)}$ ($20 \leq a \leq 80$, $5 \leq b \leq 50$, $0.1 \leq c \leq 15$, and $80 \leq c+n \leq 99.9$) where the subscripts are atomic percentages that total 100% of the constituent elements associated with the respective subscript.

A resistivity of the phase-changeable material increases as an amount of silicon and nitrogen becomes larger. In particular embodiments of the present invention, the silicon atoms may be doped with about 0.25% to about 8% and the nitrogen with about 0.25% to about 10% of a total number of atoms in the phase-changeable material.

The phase-changeable material is interposed between first and second electrodes and supplied with an electrical signal (a current pulse) through the electrodes. The first and second electrodes may be a conductive material containing nitrogen N, a conductive material containing carbon C, titanium Ti, tungsten N, molybdenum Mo, tantalum Ta, titanium silicide TiSi, tantalum silicide TaSi and/or a combination thereof.

In one embodiment of the present invention, the first and/or second conductive electrodes may also further include one of aluminum Al, aluminum-copper alloy Al—Cu, aluminum-copper-silicon alloy Al—Cu—Si, tungsten silicide WSi, copper Cu, tungsten titanium TiW and/or a combination thereof.

The conductive material containing nitrogen may be titanium nitride TiN, tantalum nitride TaN, molybdenum nitride MoN, niobium nitride NbN, titanium silicon nitride TiSiN, titanium aluminum nitride TiAlN, titanium boron nitride TiBN, zirconium silicon nitride ZrSiN, tungsten silicon nitride WSiN, tungsten boron nitride WBN, zirconium aluminum nitride ZrAlN, molybdenum silicon nitride MoSiN, molybdenum aluminum nitride WON, tantalum silicon nitride TaSiN, tantalum aluminum nitride TaAlN, titan oxide nitride TiON, titanium aluminum oxide nitride TiAlON, tungsten oxide nitride WON and/or tantalum oxide nitride TaON. The conductive material containing carbon includes a conductive carbon such as graphite.

The phase-changeable material in a polycrystalline state or containing nitrogen ingredients may be formed using a sputtering technique. For example, the sputtering technique may use a nitrogen gas as a source gas and an argon gas (an inert gas) as a carrier gas, targeting the chalcogen compound. In addition, the sputtering may be carried out tinder temperature conditions at which the phase-changeable material is in a polycrystalline state having small grains. For example, the temperature may range from about 100° C. to about 350° C.

The phase-changeable material containing silicon may be formed through use of a sputtering technique that uses an argon gas of about 30 sccm to about 100 sccm, at a temperature ranging from about 100° C. to about 350° C., with a power of about 100 watts to about 2000 watts, targeting the silicon-chalcogen compound.

The phase-changeable material containing silicon and nitrogen may be formed by use of a sputtering technique that uses an argon gas of about 30 sccm to about 200 sccm and a nitrogen gas of about 0.1 sccm to about 20 sccm, at a temperature ranging from about 100° C. to about 350° C., at a power of about 100 watts to about 2000 watts.

Embodiments of the present invention also provide phase-changeable memory devices that include a phase-changeable material. The phase-changeable memory devices include a phase-changeable material pattern and first and second electrodes electrically connected to the phase-changeable material pattern to provide an electrical signal thereto. The first and second electrodes face each other. The phase-changeable material pattern includes nitrogen and/or silicon ingredients. The phase-changeable material pattern may be in a polycrystalline state having very small grains.

The phase-changeable memory devices may further include a transistor having a source region, a drain region and a gate electrode, a lower interconnection electrically connected to the drain region, an upper metal interconnection connected to one of the first and second electrodes. In this case, the other electrode of the first and second electrodes (i.e., the electrode not connected to the upper metal interconnection) is electrically connected to the source region.

The transistor serves as a switch for activating a specific phase-changeable memory cell (i.e., a phase-changeable material pattern), and performs writing or reading operations based on a voltage applied to the upper and lower interconnections.

The upper interconnection may be connected to one of the first and second electrodes directly or through a conductive plug.

Embodiments of the present invention also provide methods of fabricating a phase-changeable memory device including the phase-changeable material.

In certain embodiments of the present invention, fabricating the phase-changeable memory device includes forming a first electrode on a semiconductor substrate, forming a phase-changeable material pattern including nitrogen and/or silicon that is electrically connected to the first electrode, and forming an upper electrode on the phase-changeable material pattern. The phase-changeable material pattern may be formed by a sputtering technique at a temperature where the phase-changeable material has a polycrystalline state (e.g., in the range of about 100 to about 350° C.).

In other embodiments of the present invention, fabricating the phase-changeable memory device includes providing a semiconductor substrate with an interlayer dielectric layer, forming a lower intermetal dielectric layer on the interlayer dielectric layer, forming a first electrode passing through the lower intermetal dielectric layer, sequentially forming a phase-changeable material pattern in a polycrystalline state including nitrogen and/or silicon and a second electrode on the first electrode and the lower intermetal dielectric layer, and forming an upper intermetal dielectric layer on the lower intermetal dielectric layer to cover the phase-changeable material pattern and the second electrode.

Forming of the phase-changeable material pattern and the second electrode may include forming a phase-changeable material layer in a polycrystalline state including nitrogen and/or silicon atoms on the first electrode and the lower intermetal dielectric layer, forming a second electrode layer on the phase-changeable material layer, and patterning the second electrode layer and the phase-changeable material layer to be electrically connected to the first electrode.

Providing the semiconductor substrate including the interlayer dielectric layer may include forming a transistor including a source region, a drain region and a gate electrode at the semiconductor substrate, forming the interlayer dielectric layer on the semiconductor substrate to cover the transistor, forming an opening for exposing the source region and the drain region by patterning the interlayer dielectric layer, and filling the opening with conductive material to form a contact pad and a lower interconnection that are electrically connected to the source and the drain regions, respectively. The first electrode is electrically connected to the contact pad.

In some embodiments of the present invention, fabrication further includes planarizingly etching the upper intermetal dielectric layer to expose the upper electrode, forming an interconnection material after the planarizing etching, and forming an upper interconnection to be electrically connected to the upper electrode by patterning the interconnection material.

In further embodiments, fabrication includes forming an opening exposing a portion of the upper electrode by patterning the upper intermetal dielectric layer, forming the conductive plug for filling the opening, forming an interconnection material on the upper intermetal dielectric layer and a conductive plug, and forming an upper interconnection by patterning the interconnection material to be electrically connected to the conductive plug.

In still further embodiments of the present invention, fabricating the phase-changeable memory device includes forming a first electrode on the semiconductor substrate, forming a phase-changeable material pattern in a polycrystalline state to be electrically connected to the first electrode, and forming an upper electrode on the phase-changeable material pattern.

DESCRIPTION OF EXEMPLARY EMBODIMENTS OF THE INVENTION

Figure 1:
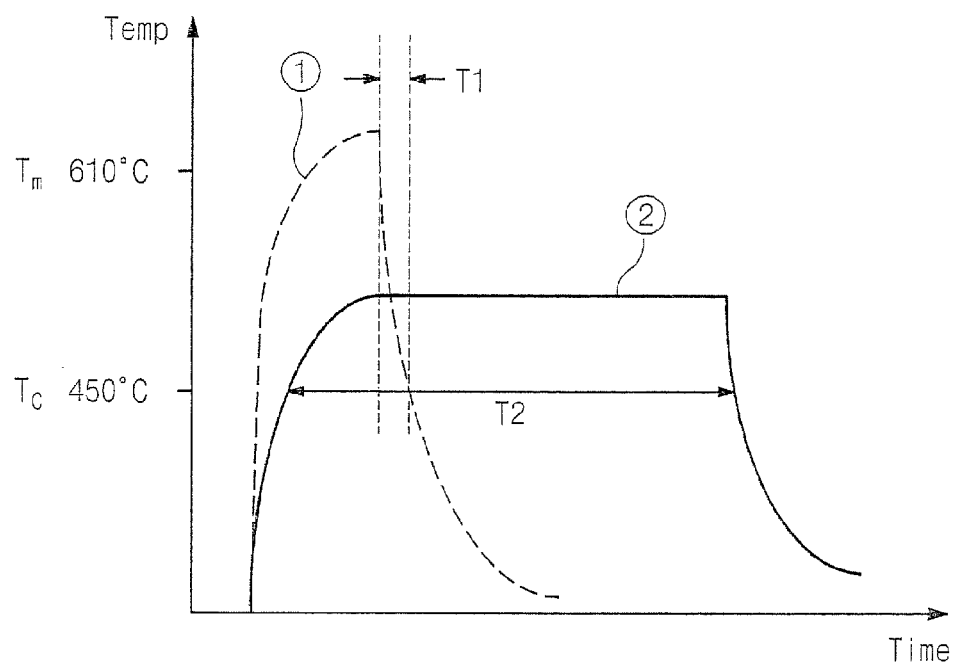
FIG. 1 is a graph showing a writing operation of a phase-changeable memory device.

The present invention will now be described more fully with reference to the accompanying drawings, in which preferred embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the size or thickness of layers and regions are exaggerated for clarity. Like numbers refer to like elements. As used herein the term "and/or" includes any and all combinations of one or more of the associated listed items.

It will be understood that although the terms first and second may be used herein to describe various regions, layers, and/or sections, these regions, layers, and/or sections should not be limited by these terms. These terms are only used to distinguish one region, layer, or section from another region, layer, or section. Thus, a first region, layer, or section discussed below could be termed a second region, layer, or section, and similarly, a second without departing from the teachings of the present invention.

The phase-changeable memory device, as illustrated in FIG. 1, utilizes phase-changeable materials whose crystalline state is varied between a polycrystalline state and an amorphous state depending on applied heat. That is, when a high current pulse is applied to the phase-changeable materials for a short time (e.g., 1 ns-10 ns), the phase-changeable materials change into an amorphous state (reset state) having a high resistivity, but when a low current plus is applied for a long time (e.g., 30 ns-50 ns), the phase-changeable materials changes into the crystalline state (set state) having a low resistivity. Thus, if the phase-changeable material layer is heated to a temperature higher than a melting point ($T_m$) thereof (a resistor heated by a current pulse) and then cooled for a short time (T1), the phase-changeable material layer becomes amorphous (referring to a curve ①). If the phase-changeable material layer is heated to a temperature lower than the melting temperature ($T_m$) but higher than the crystallization temperature ($T_c$) (a resistor heated by a current pulse), maintained for a specific time T2 longer than T1 and cooled, the phase-changeable material becomes crystalline (referring to a curve ②).

Certain embodiments of the present invention utilize a phase-changeable material that can have increased resistance over conventional phase-changeable materials, thereby reducing the current pulse required in generating heat to change the crystalline state of the phase-changeable material layer. Such may be the case because the heat generated by the current pulse is proportional to the resistance. In particular embodiments of the present invention, a polycrystalline phase-changeable material layer is provided that includes small grains, e.g., less than about 100 nm. The polycrystalline phase-changeable material layer may also reduce and/or prevent contaminants from penetrating into the phase-changeable material layer because a distance for the contaminant to diffuse increases. For instance, elements of an electrode formed on the phase-changeable material layer that penetrate the phase-changeable material layer during subsequent thermal processes, etc., may be reduced.

The phase-changeable material layer according to certain embodiments of the present invention contains nitrogen atoms and/or silicon atoms. In some embodiments, the nitrogen atoms and/or silicon atoms exist not only inside the small grains (inside crystals) but also at the interface of the grains of the polycrystalline phase-changeable material. Due to the nitrogen atoms and/or silicon atoms, the resistivity of the phase-changeable material layer increases, resulting in a decrease of the current pulse required for changing the crystalline state of the phase-changeable material layer. The nitrogen and/or silicon atoms suppress the grain growth of the phase-changeable material, such that the grains of the phase-changeable material layer may be small. As the concentration of the nitrogen and/or silicon increases, the size of the crystal decreases. For example, in certain embodiments of the present invention, the phase-changeable material layer has a polycrystalline state having grains less than about 100 nm. In particular embodiments of the present invention, the phase-changeable material layer has a grain size of about 40 mn grains or smaller.

Chalcogen compounds can be characterized as $A_xB_{100-x}$, wherein component A includes a chalcogen, such as tellurium Te, selenium Se, sulfur S, and/or polonium Po, and component B is at least one of antimony Sb, arsenic As, germanium Ge, tin Sn, phosphate P, silver Ag, oxygen O, indium In and/or bismuth Bi. For example, the chalcogenide compound may be Ge—Sb—Te, As—Sb—Te, As—Ge—Sb—Te, Sn—Sb—Te, In—Sn—Sb—Te, Ag—In—Sb—Te, 5A group element-Sb—Te, 6A group element-Sb—Te, 5A group element-Sb—Se, 6A group element-Sb—Se, etc.

In certain embodiments of the present invention, the phase-changeable material layer can be a chalcogen compound containing nitrogen, such as a nitrogen doped chalcogen compound, characterized as $(A_xB_{100-x})_nN_{100-n}$, wherein $x \leq 80$, $75 \leq n \leq 99.75$ where the subscripts are atomic percentages that total 100% of the constituent elements associated with the respective subscript. Namely, the phase-changeable material layer contains from about 0.25 to about 25% nitrogen atoms with respect to the total number of atoms of the ingredients. If the chalcogen compound includes Te, Sb, Ge, the phase changeable material may be characterized as $(Te—Sb—Ge)_nN_{100-n}$, wherein $75 \leq n \leq 99.75$ and the subscripts are atomic percentages that total 100% of the constituent elements associated with the respective subscript. Namely, the phase-changeable material can be characterized as $(Te_aSb_bGe_{100-(a+b)})_nN_{100-n}$, wherein $a \leq 80$, $5 \leq b \leq 50$, $75 \leq n \leq 99.75$ where the subscripts are atomic percentages that total 100% of the constituent elements associated with the respective subscript.

In certain embodiments of the present invention, the phase-changeable material layer can be a silicon doped chalcogen compound characterized as $(A_xB_{100-x})_nSi_{100-n}$, wherein $x \leq 80$, $85 \leq n \leq 99.9$ and the subscripts are atomic percentages that total 100% of the constituent elements associated with the respective subscript. Namely, the phase-changeable material layer contains from about 0.1 to about 15% silicon atoms with respect to the total number of atoms of the ingredients. If the chalcogen compound includes Te, Sb, Ge, the phase changeable material may be characterized in $(Te—Sb—Ge)_nS_{100-n}$, wherein $85 \leq n \leq 99.9$ and the subscripts are atomic percentages that total 100% of the constituent elements associated with the respective subscript. Namely, the phase-changeable material can be characterized as $(Te_aSb_bGe_{100-(a+b)})_nSi_{100-n}$, wherein $a \leq 80$, $5 \leq b \leq 50$, $85 \leq n \leq 99.9$ where the subscripts are atomic percentages that total 100% of the constituent elements associated with the respective subscript.

In certain embodiments of the present invention, the phase-changeable material layer can be a chalcogen compound containing nitrogen and silicon, such as a nitrogen and silicon doped chalcogen compound, characterized as $(A_xB_{100-x})_nSi_cN_{100-(n+c)}$, wherein $x \leq 80$, $65 \leq n \leq 99.8$, $80 \leq n+c \leq 99.9$, $0.1 \leq c \leq 15$ and the subscripts are atomic percentages that total 100% of the constituent elements associated with the respective subscript. Namely, the phase-changeable material layer contains from about 0.1 to about 15% silicon atoms and from about 0.1 to 20% nitrogen atoms with respect to the total number of atoms of the ingredients. In particular embodiments of the present invention, the phase-changeable material may contain from about 0.25 to about 8% silicon atoms and from about 0.25 to 10% nitrogen atoms. Thus, in particular embodiments of the present invention, the chalcogen compound containing nitrogen and silicon may be characterized as $(A_xB_{100-x})_nSi_cN_{100-(n+c)}$, wherein $x \leq 80$, $82 \leq n \leq 99.5$. $90 \leq n+c \leq 99.75$, $0.25 \leq c \leq 8$ and the subscripts are atomic percentages that total 100% of the constituent elements associated with the respective subscript. If the chalcogen compound includes Te, Sb, Ge, the phase changeable material may be characterized as $(Te-Sb-Ge)_nSi_cN_{100-(n+c)}$, wherein $0.1 \leq c \leq 15$, $80 \leq n \leq 99.9$ and, in some embodiments, $0.25 \leq c \leq 8$, $90 \leq n \leq 99.75$ where the subscripts are atomic percentages that total 100% of the constituent elements associated with the respective subscript. Namely, the phase-changeable material can be characterized as $(Te_aSb_bGe_{100-(a+b)})_nSi_cN_{100-(n+c)}$, wherein $a \leq 80$, $5 \leq b \leq 50$, $0.1 \leq c \leq 15$, $80 \leq n \leq 99.9$ and in some embodiments, $a \leq 80$, $5 \leq b \leq 50$, $0.25 \leq c \leq 8$, $90 \leq n \leq 99.75$ where the subscripts are atomic percentages that total 100% of the constituent elements associated with the respective subscript. A resistivity of the phase-changeable material increases as an amount of silicon and nitrogen becomes larger.

First, a chalcogen compound containing nitrogen will be discussed. In some embodiments, the phase-changeable material layer of the present invention may include nitrogen atoms of about 0.25% to about 25% with respect to total number of atoms in the composition.

Figure 2:
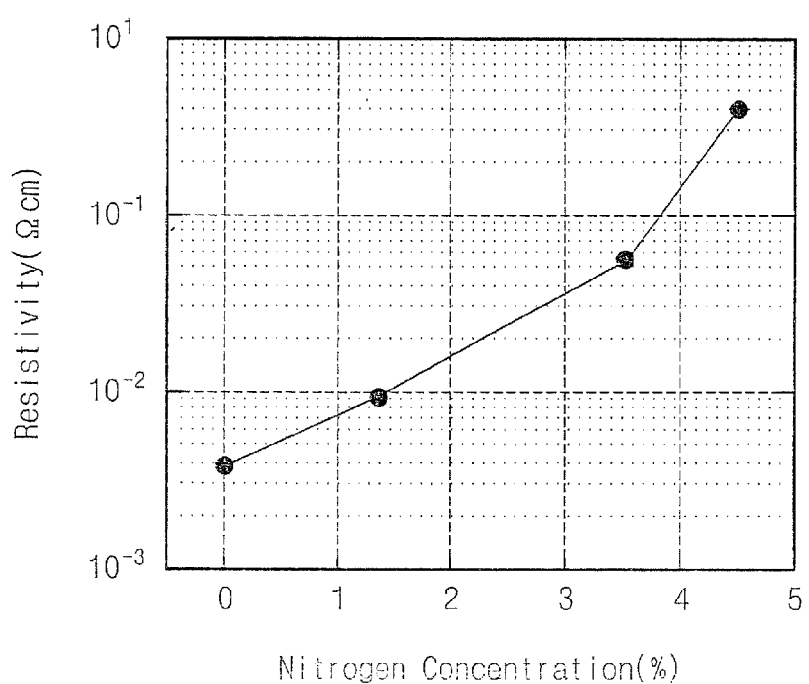
FIG. 2 is a graph showing resistivity of GST containing nitrogen (Ge—Sb—Te—N) according to concentrations of the nitrogen.

FIG. 2 is a graph showing resistivity of GST containing nitrogen atoms (Ge—Sb—Te—N) according to concentrations of the nitrogen. A parallel axis in the FIG. 2 refers to atomic percent of the nitrogen atoms contained in the GST, and a vertical axis refers to resistivity ($\Omega$cm). Referring to FIG. 2, the resistivity of the GST increases as the concentration of nitrogen atoms.

Figure 3:
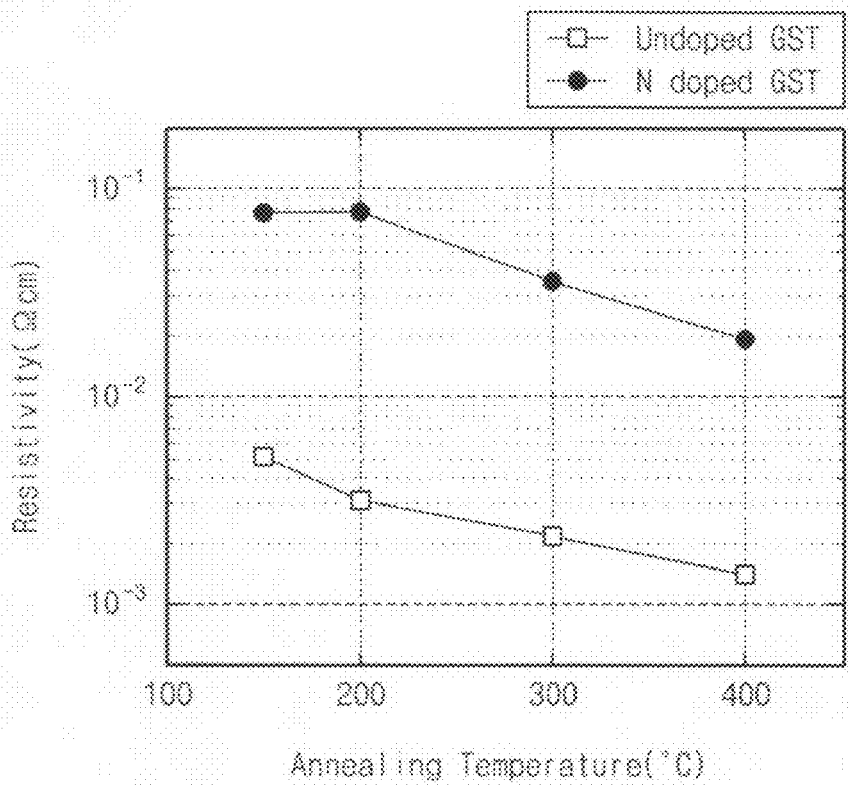
FIG. 3 is a graph showing resistivities of conventional Ge—Sb—Te and Ge—Sb—Te—N according to certain embodiments of the present invention.

FIG. 3 is a graph showing resistivity of conventional Ge—Sb—Te and Ge—Sb—Te—N according to certain embodiments of the present invention according to annealing temperatures. The horizontal axis refers to an annealing temperature (° C.), and the vertical axis refers to resistivity ($\Omega$cm). In FIG. 3, -●- represents a resistivity of GST containing 7 atomic percent nitrogen and -□- represents a resistivity of conventional GST. Referring to FIG. 3, the resistivity of conventional Ge—Sb—Te reduces to about 2 m$\Omega$cm but the resistivity of GST containing 7% nitrogen atoms is measured to be greater that that of conventional GST (about 20 m$\Omega$cm). That is, the resistivity of the GST containing nitrogen atoms according to embodiments of the present invention increases about 10 times as high as the conventional one.

Figure 4:
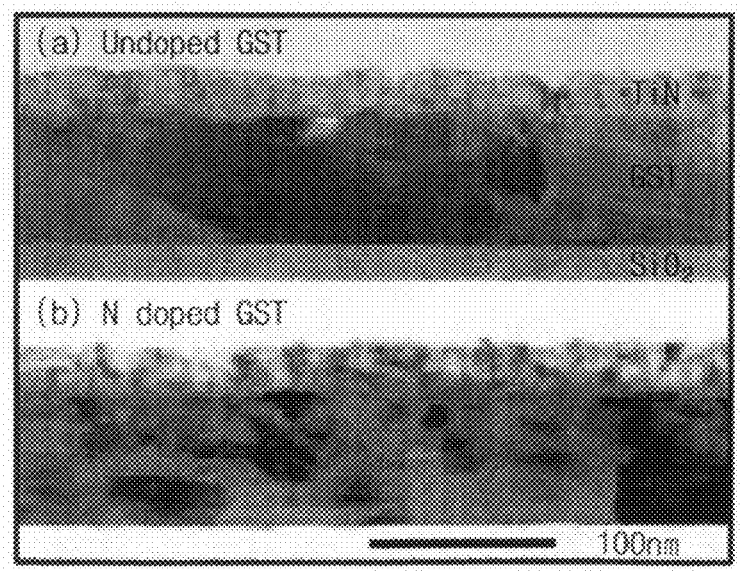
FIG. 4 is a TEM showing a crystalline state of the conventional GST and a crystalline state of the GST containing 7% nitrogen according to certain embodiments of the present invention after 500° C. annealing.

FIG. 4 is a transmission electron microscopy (TEM) picture showing a crystalline state of the conventional GST and a crystalline state of the GST containing 7% nitrogen atoms according to certain embodiments of the present invention after 500° C. annealing. The upper TEN picture of FIG. 4 shows a crystalline state of a conventional GST and the lower one shows a crystalline state of GST containing nitrogen atoms according to certain embodiments of the present invention. The pictures show the conventional GST has a monocrystalline state of which grain size is about more than 100 nm but the GST containing nitrogen has a polycrystalline state of which the grains are about 40 nm or smaller.

Figure 5:
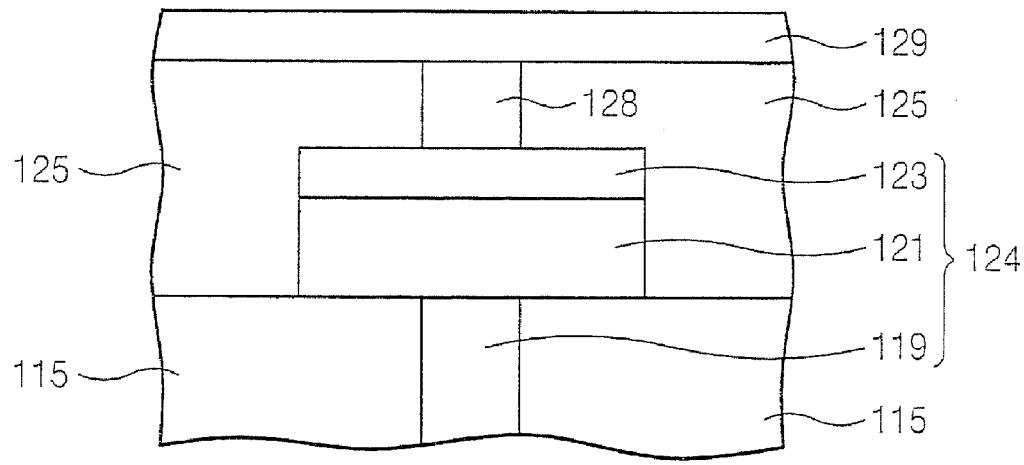
FIG. 5 is a schematic cross-sectional view showing a variable resistor in accordance with certain embodiments of the present invention.

FIG. 5 is a schematic cross-sectional view showing a variable resistor in accordance with certain embodiments of the present invention. As seen in FIG. 5, a first electrode 119, a phase-changeable material pattern 121, and a second electrode 123 are provided. A lower intermetal dielectric layer 115 and an upper intermetal dielectric layer 125 and an upper interconnection 129 are also provided. A conductive plug 127 electrically connects the upper interconnection 129 and the second electrode 123.

The first electrode 119 is contact-plug-shaped and penetrates a specific region of the lower intermetal dielectric layer 115. The phase-changeable material patter 121 is disposed on the lower intermetal dielectric layer 115 and the first electrode 119 so as to be connected to the first electrode 119. The second electrode 123 is disposed on a surface of the phase-changeable material pattern 121. The conductive plug 128 penetrates a specific region of the upper interconnection dielectric layer 125 so as to be connected to a portion of the second electrode 123. The upper interconnection 129 is disposed on the upper dielectric layer 125 so as to be connected to the conductive plug 128.

As described above, the phase-changeable material pattern 121 has a high resistivity because of its polycrystalline state has a plurality of small grains. The phase-changeable material pattern 121 may be a chalcogenide compound containing nitrogen. For example, the phase-changeable material pattern 121 may be any one of Ge—Sb—Te—N, As—Sb—Te—N, As—Ge—Sb—Te—N. Sn—Sb—Te—N, In—Sn—Sb—Te—N, a 5A group element-Sb—Te—N, a 6A group element-Sb—Te—N, a 5A group-Sb—Se—N, and/or a 6A group-Sb—Se—N. An amount of the nitrogen atoms may be from about 0.25% to about 25% with respect to the total number of atoms of the phase-changeable material pattern. Resistivity of the phase-changeable material layer according to concentrations of the nitrogen atoms is illustrated in FIG. 2. As seen in FIG. 2, the resistivity increases as the concentration of the nitrogen atoms increases.

An interface region between the first electrode 119 and the phase-changeable material pattern 121 depends on a diameter of the first electrode 119 and the crystalline state of the phase-changeable material changes at the interface region thereof. Furthermore, the second electrode 123 contacts with the surface and, in some embodiments, the entire surface, of the phase-changeable material pattern 121. Therefore, when current flows between the two electrodes 119 and 123 via the phase-changeable material pattern 121, current density thereof increases because the interface region between the first electrode 119 and the phase-changeable material pattern 121 is narrow. Therefore, the crystalline state thereof varies. In the drawings, the first electrode is contact-plug-shaped but the second electrode or both may be contact-plug-shaped. The first electrode 119, the phase-changeable material pattern 121 and the second electrode 123 may provide a variable resistor 124, that is, a phase-changeable memory cell.

The first electrode 119 and/or the second electrode 123 may be a conductive material containing nitrogen, a conductive material containing carbon C, titanium Ti, tungsten NV, molybdenum Mo, tantalum Ta, titanium silicide TiSi, tantalum silicide TaSi and/or a combination thereof. The conductive material containing nitrogen may be titanium nitride TiN, tantalum nitride TaN, molybdenum nitride MoN, niobium nitride NbN, titanium silicon nitride TiSiN, titanium aluminum nitride TiAlN, titanium boron nitride TiBN, zirconium silicon nitride ZrSiN, tungsten silicon nitride WSiN, tungsten boron nitride WBN, zirconium aluminum nitride ZrAlN, molybdenum silicon nitride MoSiN, molybdenum aluminum nitride MoAlN, tantalum silicon nitride TaSiN, tantalum aluminum nitride TaAlN, titan oxide nitride TiON, titan aluminum oxide nitride TiAlON, tungsten oxide nitride WON and/or tantalum oxide nitride TaON. The conductive material containing carbon may include graphite, for instance.

The conductive plug 127 electrically connecting the upper interconnection 129 and the second electrode 123 and may be formed of aluminum Al, aluminum-copper alloy Al—Cu, aluminum-copper-silicon alloy Al—Cu—Si, tungsten silicide WSi, copper Cu, tungsten titanium TiW, tantalum Ta, molybdenum Mo, tungsten W, etc. The upper interconnection 129 may serve as a data line (a bit line) transferring logic information stored in the variable resistor 124. The upper interconnection 129 may be formed of aluminum Al, aluminum-copper alloy Al—Cu, aluminum-copper-silicon alloy Al—Cu—Si, tungsten suicide WSi, copper Cu, tungsten titanium TiW, tantalum Ta, molybdenum Mo, tungsten W, etc.

In FIG. 5, the second electrode 123 serves as a barrier layer preventing a reaction between the conductive plug 127 and the phase-changeable material pattern 121.

Figure 6:
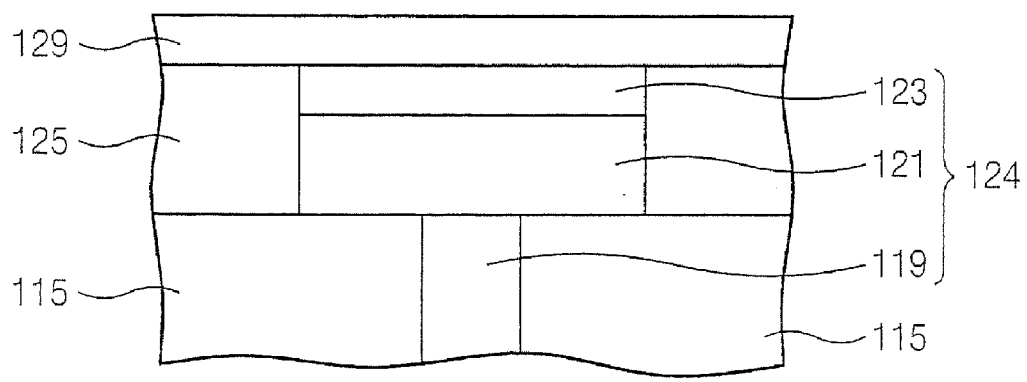
FIG. 6 is a schematic cross-sectional view showing a variable resistor in accordance with additional embodiments of the present invention.

FIG. 6 is a schematic cross-sectional view showing certain embodiments of a variable resistor structure including the above nitrogen containing phase-changeable material layer. The variable resistor of FIG. 6 has substantially the same structure as that of FIG. 5, however, the upper interconnections and electrical connections differ. As seen in FIG. 6, the upper interconnection 129 directly contacts the second electrode 123 without a conductive plug.

Figure 7:
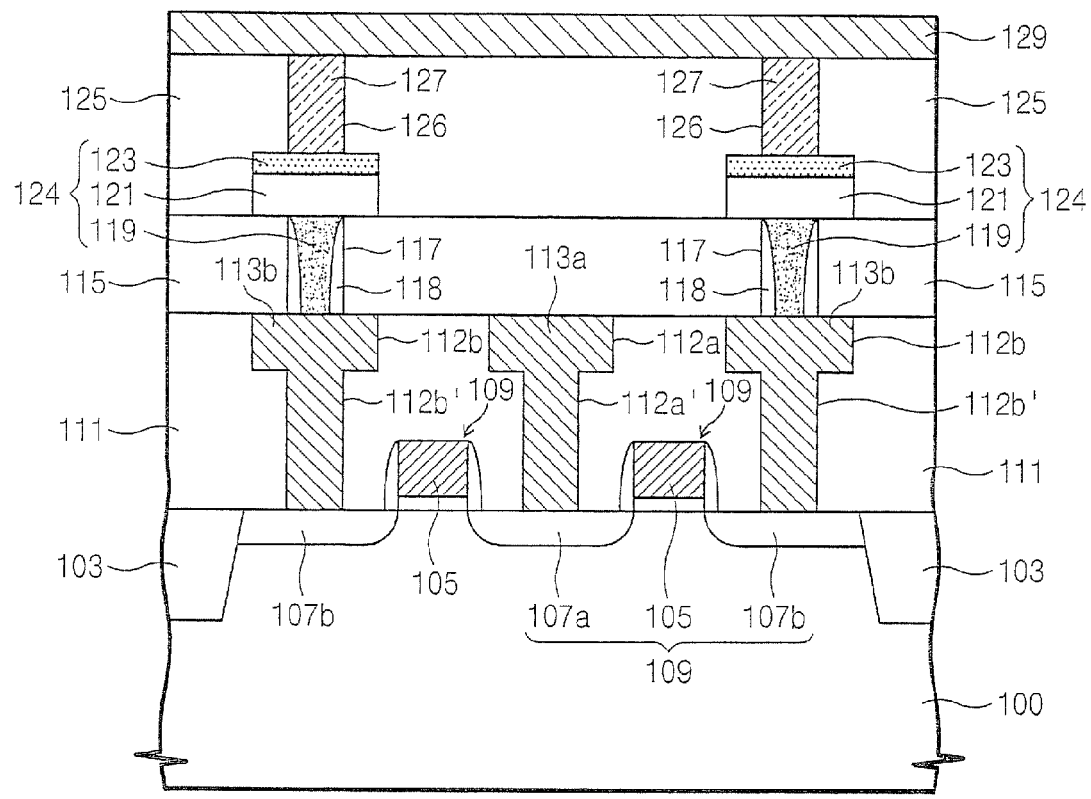
FIG. 7 is a schematic cross-sectional view showing a phase-changeable memory device employing the variable resistor of FIG. 5.

FIG. 7 is a schematic cross-sectional view illustrating a phase-changeable memory device employing the variable resistor of FIG. 5. As seen in FIG. 7, the phase-changeable memory device includes a semiconductor substrate 100, a field isolation region 103, an interlayer dielectric layer 111, a transistor 109, a lower interconnection 113a, a contact pad 113b, a contact hole 117, an insulating spacer 118, a drain region 107a, a gate electrode 105 and a source region 107b.

The field isolation region 103 is formed in the semiconductor substrate 100 to define a predetermined shaped active region. The device isolation region 103 may, for example, be formed by a local oxidation of silicon or trench isolation technologies. The transistor 109 runs the active region and a field isolation region 103 of the semiconductor substrate 100. The transistor 109 includes a gate electrode 105 and source/drain regions 107b and 107a that are formed at both sides of the gate electrode 105. An active region between the source/drain regions 107b and 107a under the gate electrode 105 corresponds to a channel of the transistor 109. The transistor 109 may serve as a word line.

The interlayer dielectric layer 111 is provided on the semiconductor substrate 100 to cover the transistor 109. A contact pad 113b and a lower interconnection 113a are placed in the interlayer dielectric layer 111, which electrically connect to the source and drain regions 107b and 107a, respectively. The lower interconnection 113a runs parallel to the transistor 109.

A lower intermetal dielectric layer 115 of FIG. 5 is disposed on the contact pad 113b, the lower interconnection 113a and the interlayer dielectric layer 111. The first electrode 119 is electrically connected to the contact pad 113b. The phase-changeable material pattern 121, a second electrode 123, a conductive plug 127 and an upper interconnection 129 are disposed as described above with reference to FIG. 5.

To reduce an interface region between the first electrode 119 and the phase-changeable material pattern 121, the insulating spacer 118 may be interposed between the contact hole 117 and the first electrode 119, that is, a diameter of the contact hole 117 depends on a resolution of the photolithographic process. Therefore, the insulating spacer 118 is disposed to reduce the diameter and the first electrode 119 fills the reduced diameter contact hole. Thus, an interface area between the first electrode 119 and the phase-changeable material pattern 121 may be formed smaller than the resolution of the photolithographic process. As a result, current needed to perform a write operation may be further reduced.

Operations of the phase-changeable memory device illustrated in FIG. 7 are explained below with reference to FIG. 8, which is an equivalent circuit view of the device illustrated in FIG. 7.

Figure 8:
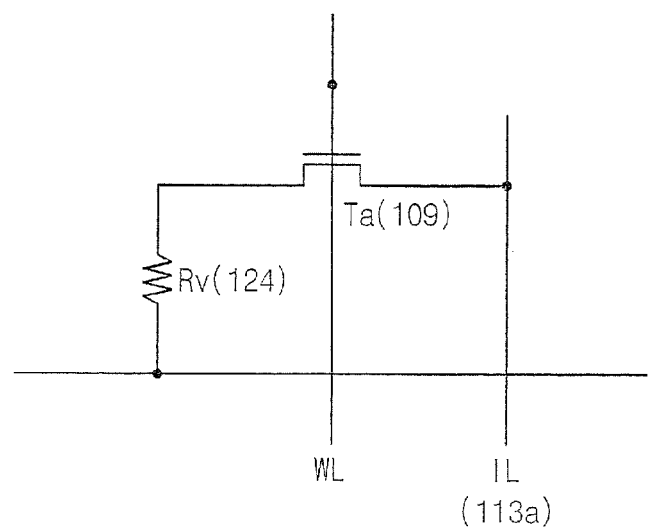
FIG. 8 is an equivalent circuit diagram corresponding to FIG. 7.

As seen in FIG. 8, the phase-changeable memory device includes an access transistor Ta 109 and a variable resistor Rv 124. The variable resistor Rv 124 includes a phase-changeable material pattern 121 interposed between the two electrodes 119 and 123. An upper interconnection 129 is connected to a second electrode 123 of the variable resistor Rv 124 and serves as a bit line BL. The access transistor Ta 109 includes a drain region, a source region and a gate electrode. The drain region is electrically connected to the lower interconnection IL 113a, the source region is electrically connected to the first electrode of the variable resistor Rv 124, and the gate electrode is a word line WL.

In a write operation for writing logic information (e.g., "0" (a high resistance state) or "1" (a low resistance state)) to the variable resistor Rv 124, a signal sufficient to turn on the access transistor Ta is applied to the word line WL and a bit line BL is grounded. Then, a signal is input to the lower interconnection IL. The signal input to the lower interconnection IL corresponds to a current pulse having a magnitude and duration corresponding to the logic information to be written. Therefore, current flows between the lower interconnection IL and the bit line BL through the variable resistor Rv. The phase-changeable material pattern of the variable resistor Rv changes the crystalline state thereof based on the current pulse, thereby changing a resistance of the variable resistor Rv.

According to certain embodiments of the present invention, because the resistivity of the phase-changeable material pattern of the variable resistor Rv is greater than that of a conventional phase-changeable material pattern, the amplitude of the current pulse (i.e., a signal applied to the lower interconnection) that provides the desired heating may be less than the amplitude of a current pulse that would produce the desired heating if a conventional phase-changeable material pattern were used.

With regard to a read operation for reading logic information of the variable resistor Rv, a signal sufficient to turn on the access transistor Ta is applied to a word line WL, the lower interconnection IL is grounded, and an operation voltage is applied to a bit line BL. In this case, the operation voltage is not sufficient to change the crystalline state of the phase-changeable material pattern. Therefore, current flows between the bit line BL and the lower interconnection IL via the variable resistor Rv and a resistivity of the phase-changeable material pattern (i.e., logic information) is sensed through the bit line BL.

FIGS. 9A through 9H are cross-sectional views illustrating methods of forming a phase-changeable memory device of FIG. 7.

Figure 9A:
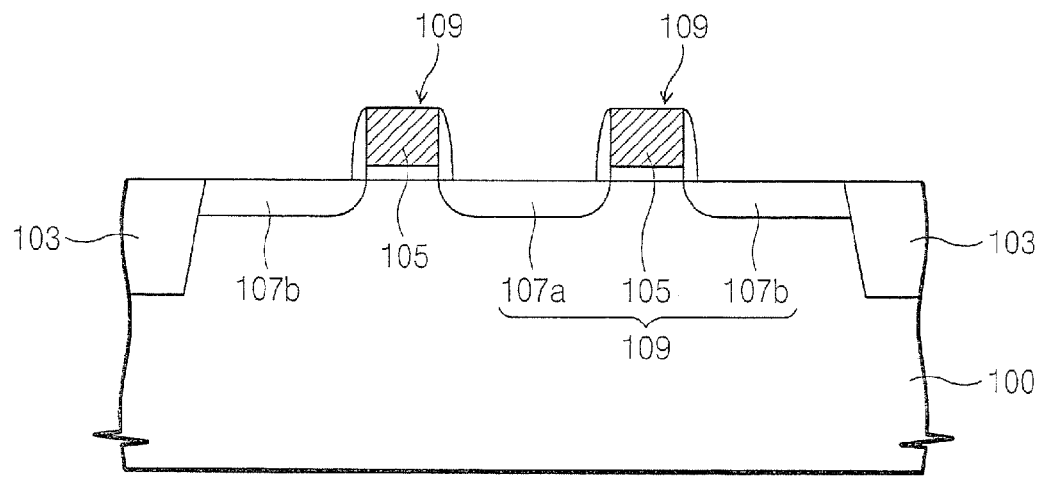
FIGS. 9A through 9H are cross-sectional views illustrating methods of forming the phase-changeable memory device of FIG. 7.

Referring to FIG. 9A, a conventional MOS field effect transistor (MOSFET) is fabricated by forming a field isolation region 103 and a transistor 109 in a semiconductor substrate 100. The field isolation region 103 is an insulation region to define an active region, and may be formed by local oxidation of silicon (LOCOS) or a shallow trench isolation technique. The transistor 109 is formed on the semiconductor substrate 100 and includes a gate electrode 105, a source region 107b and a drain region 107a. The gate electrode 105 extends along one direction and the source and drain regions 107b and 1007a are formed at both sides of the gate electrode 105. An active region under the gate electrode 105 serves as a current path (channel) between the source and drain region 107b and 107a. A gate-insulating layer is provided between the gate electrode 105 and the channel region.

Figure 9B:
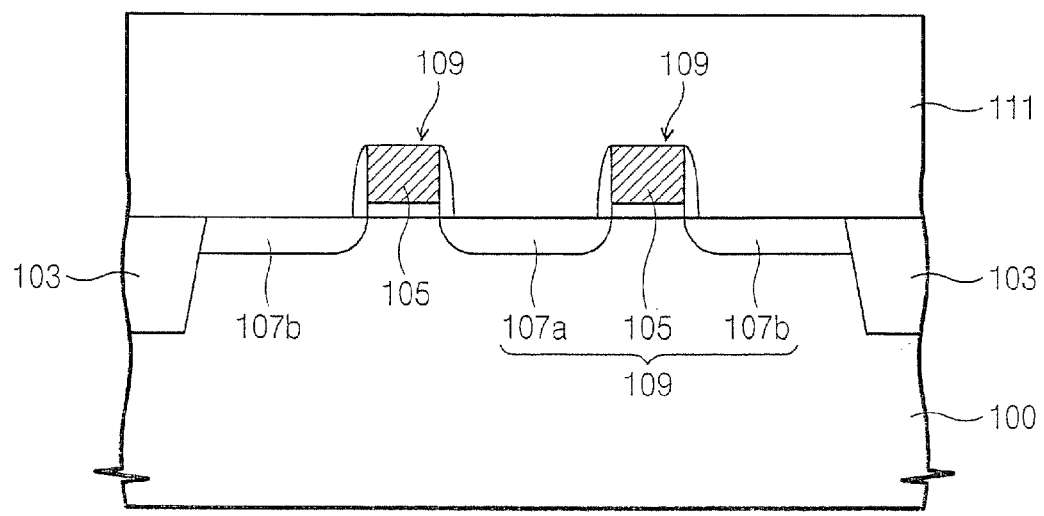

Referring to FIG. 9B, an interlayer dielectric layer 111 is formed to cover the transistor 109. The interlayer dielectric layer 111 may be formed of silicon oxide and may be formed by chemical vapor deposition (CVD).

Figure 9C:
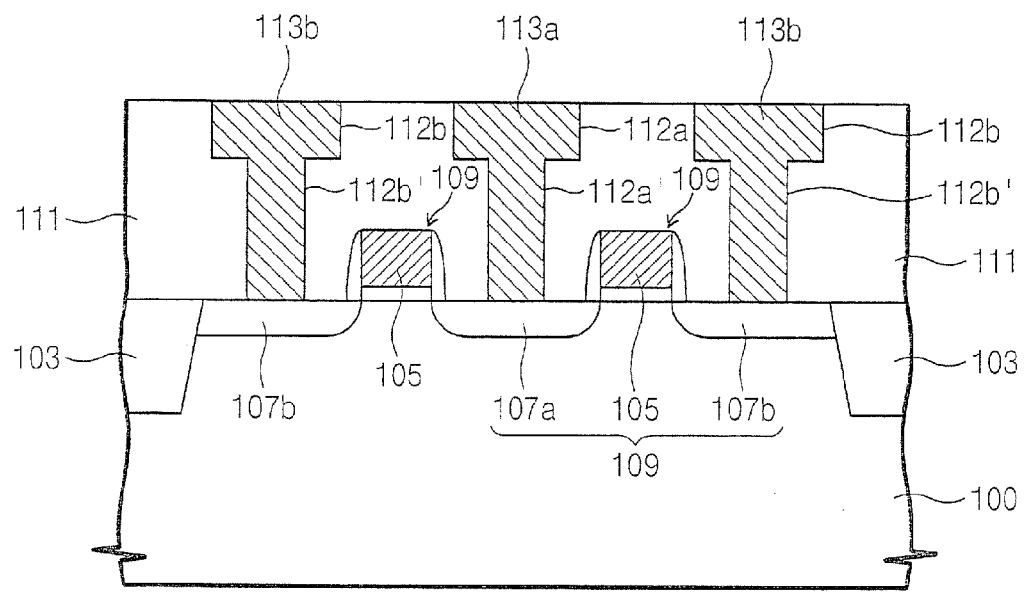

FIG. 9C illustrates a process for forming a lower interconnection 113a. The lower interconnection 113a is a conductive interconnection electrically connected to the drain region 107a of the transistor 109. For example, the lower interconnection 113a may extend parallel to the gate electrode 105. In the embodiments illustrated in FIG. 9C, the lower interconnection 113a is formed by a dual damascene process. In particular, the interlayer dielectric layer 111 is patterned to form an interconnection groove 112a and contact hole 112a' exposing the drain region 107a at a specific region of the interconnection groove 112a.

The groove 112a and the contact hole 112a' are substantially filled with conductive materials to form the lower interconnection 113a electrically connected to the drain region 107a. In this case, contact pads 113b electrically connected to the source regions 107b are also formed during the formation of the lower interconnection 113a. That is, while forming the interconnection groove 112a and the contact hole 112a', openings for contact pads 112b and contact holes 112b' exposing the source region 107b are formed. The contact holes 112b' are connected to the openings 112b. While the groove 112a and the contact hole 112a' are filled with conductive material, the openings 112b and the contact holes 112b' are also substantially filled with the conductive material. The contact pad 113b electrically connects the variable resistor 124 of FIG. 9F to the source region 107b.

In the embodiments illustrated in FIG. 9C, the lower interconnection 113a and the contact pad 113b are formed using a dual damascene process but other methods could also be used. That is, the lower interlayer dielectric layer 111 is patterned to form contact holes exposing the source and drain regions 107b and 107a. Then, a conductive material layer is formed on the interlayer dielectric layer 111 to fill the contact holes. Finally, the patterning process may be performed on the conductive material layer to form the lower interconnection and the contact pad.

Figure 9D:
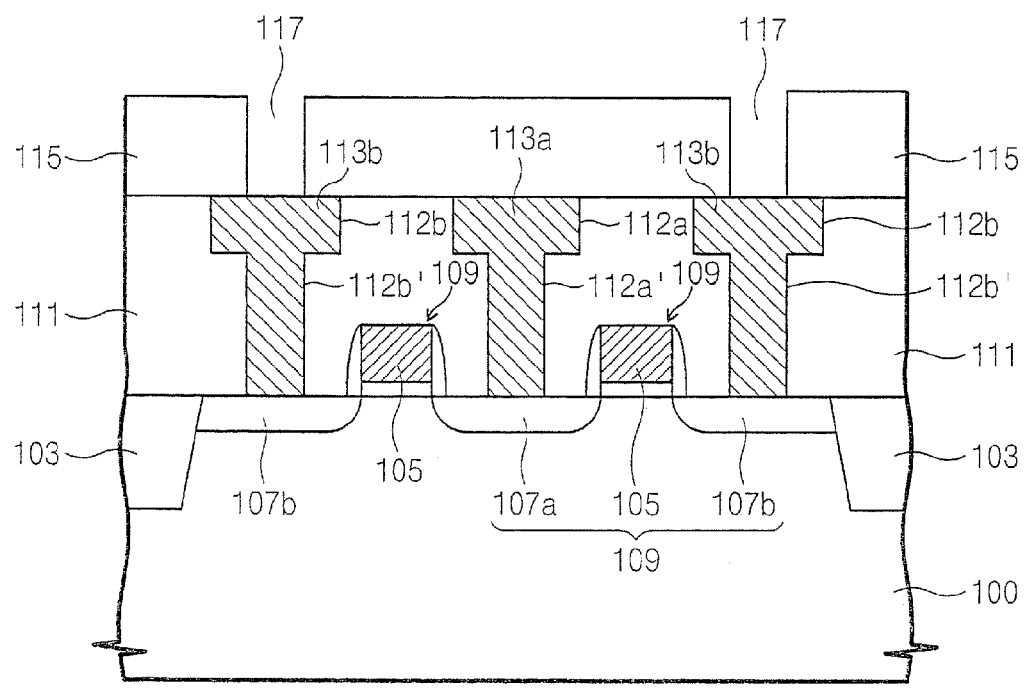

Referring to FIG. 9D, a lower intermetal dielectric layer 115 is formed on the lower interconnection 113a, the contact pad 113b and the interlayer dielectric layer 111. The intermetal dielectric layer 115 may be formed of silicon oxide by chemical vapor deposition, for example. The lower intermetal dielectric layer 115 is patterned to form contact holes 117 exposing the contact pad 113b.

Figure 9E:
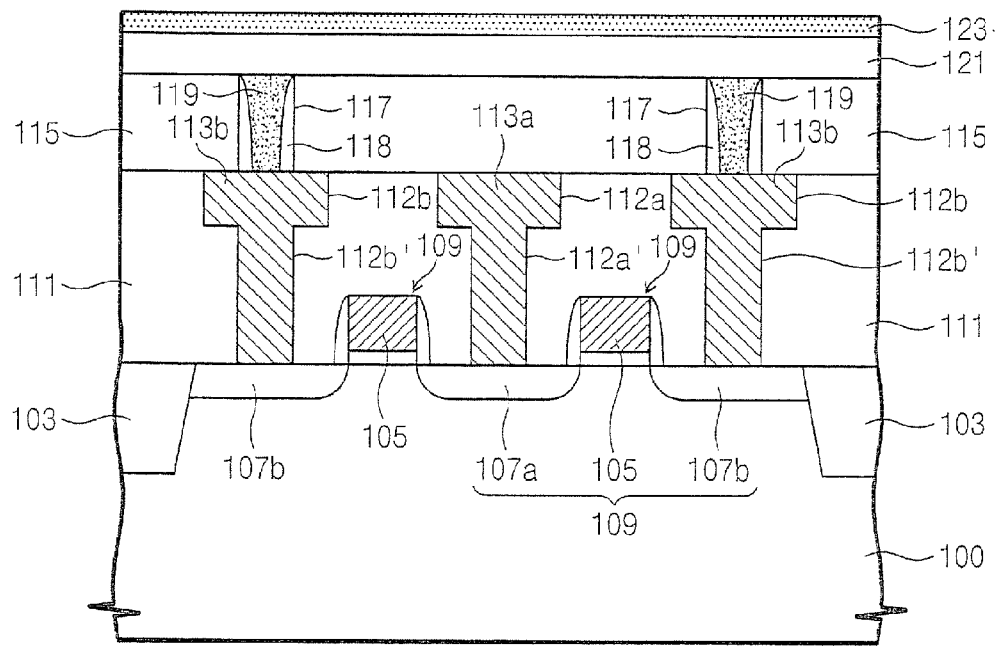

Referring to FIG. 9E, insulating spacers 118 are formed on sidewalls of the contact holes 117 exposing the contact pad 113b, thereby reducing a diameter of the contact hole 117. Therefore, an interface area between the first electrode and the phase-changeable material pattern may be reduced beyond the limitation of photolithographic process. The insulating spacers 118 are formed by an etch back process that etches an insulating layer without using an etch mask after the insulating layer is deposited.

Referring to FIG. 9E again, the insulating spacers 118 are formed, and then a first electrode 119 is formed by substantially filling the reduced diameter contact hole such that the first electrode 119 is electrically connected to the contact pad 113b. The first electrode 119 may be formed by depositing a conductive material and planarizing. Planarizing the conductive layer may be carried out, for example, by CMP or an etch back process.

The first electrode 119 may be a conductive material containing nitrogen, a conductive material containing carbon C, titanium Ti, tungsten W, molybdenum Mo, tantalum Ta, titanium suicide TiSi, tantalum silicide TaSi, and/or a combination thereof. The first electrode 119 may be formed by a chemical vapor deposition, a physical vapor deposition, an atomic layer vapor disposition, etc. The conductive material containing nitrogen may be titanium nitride TiN, tantalum nitride TaN, molybdenum nitride MoN, niobium nitride NbN, titanium silicon nitride TiSiN, titanium aluminum nitride TiAlN, titanium boron nitride TiBN, zirconium silicon nitride ZrSiN, tungsten silicon nitride WSiN, tungsten boron nitride WBN, zirconium aluminum nitride ZrAlN, molybdenum silicon nitride MoSiN, molybdenum aluminum nitride MoAlN, tantalum silicon nitride TaSiN, tantalum aluminum nitride TaAlN, titanium oxide nitride TiON, titanium aluminum oxide nitride TiAlON, tungsten oxide nitride WON and/or tantalum oxide nitride TaON.

Particular embodiments of the present invention will now be described where the first electrode 119 is formed of titanium aluminum nitride by the atomic vapor deposition. Carbon tetrachloride $TiCl_4$ gas flows into a reactor as a source gas and is adsorbed chemically on a semiconductor substrate with the insulating spacers 118. The non-adsorbed carbon tetrachloride is purged (exhausted out from the reactor) by a purging gas, and then ammonia $NH_3$ flows into the reactor as a nitrogen source. As a result, a titanium nitride layer TiN is formed. Next, aluminum trimethane $Al(CH_3)_3$ gas flows into the reactor as an aluminum source and is adsorbed on the titanium layer. The non-adsorbed trimethane gas is exhausted out from the reactor by a purging gas. Again, the ammonia gas flows into the reactor and then is purged. This cycle is repeated to form a desired thickness titanium aluminum nitride layer TiAlN. To support inflow of those source gases, a carrier gas (e.g., argon or nitrogen gas) can be used.

Referring again to FIG. 9E, a phase-changeable material layer 121 and a second electrode layer 123 are formed on the lower intermetal interconnection 115 after the first electrode 119 is formed. The phase-changeable material layer 121 contains nitrogen atoms. For example, the phase-changeable material layer 121 may be formed by a sputtering method using nitrogen gas and argon gas as a carrier gas, targeting chalcogenide compounds. In this case, the phase-changeable material layer 121 may be formed at about 100-350° C., for instance. According to certain embodiments of the present invention, the phase-changeable material layer 121 has a polycrystalline state that includes a plurality of small grains of about 100 nm or lesser. In particular embodiments, the phase-changeable material layer 121 has a grain size of about 40 nm or lesser. The phase-changeable material layer 121 includes about 0.25 to about 15 atomic percent nitrogen atoms. The chalcogen compounds may be formed of, for example, Ge—Sb—Te, As—Sb—Te, As—Ge—Sb—Te, Sn—Sb—Te, In—Sn—Sb—Te, Ag—In—Sb—Te, a 5A group element-Sb—Te, a 6A group element-Sb—Te, a 5A group element-Sb—Se, a 6A group-Sb—Se, etc. Therefore, the phase-changeable material layer 121 may be formed of Ge—Sb—Te—N, As—Sb—Te—N, As—Ge—Sb—Te—N, Sn—Sb—Te—N, In—Sn—Sb—Te—N, Ag—In—Sb—Te—N, a 5A group element-Sb—Te—N, a 6A group element-Sb—Te—N, a 5A group element-Sb—Se—N, a 6A group element-Sb—Se—N, etc.

Exemplary embodiments of forming the Ge—Sb—Te—N using sputtering will be explained hereinafter. The Ge—Sb—Te—N is formed to a thickness of from about 100 to about 1000 Å, targeting Ge—Sb—Te, under the condition of 10 mm Torr argon, about 1 mm Torr nitrogen, about 500 W DC power and about 100-350° C. The phase-changeable material layer has a polycrystalline state that includes a plurality of small grains (40 nm or lesser) as shown in FIG. 4.

The second electrode layer 123 may be formed by chemical vapor deposition, physical vapor deposition, atomic layer deposition, etc. and using the same material as the first electrode 119. For example, the second electrode 123 may be conductive materials containing nitrogen N, conductive materials containing carbon C, titanium Ti, tungsten W, molybdenum Mo, tantalum Ta, titanium silicide TiSi, tantalum silicide TaSi, and/or a combination thereof.

Exemplary embodiments of forming the second electrode with titanium aluminum nitride TiAlN using physical vapor deposition will be explained hereinafter. In particular, the method using atomic vapor deposition may be the same as what is explained above. The second electrode layer 123 may be formed about 100-1000 Å in a DC sputter targeting a titanium aluminum alloy (20 atomic percent aluminum), under the condition of about 3 mm Torr argon, about 3 mm Torr nitrogen and about 1500 W DC power.

Figure 9F:
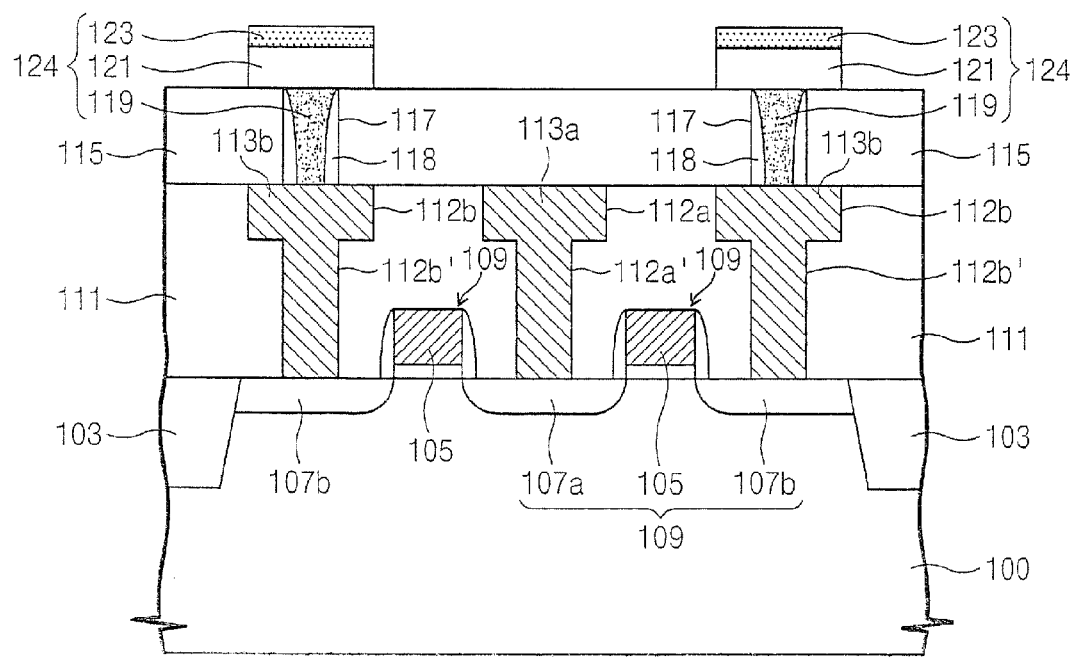

Referring to FIG. 9F, the second electrode layer 123 and the phase-changeable material layer 121 are patterned to contact with the first electrode 119, thereby forming a variable resistor 124 electrically isolated from the neighboring devices.

Figure 9G:
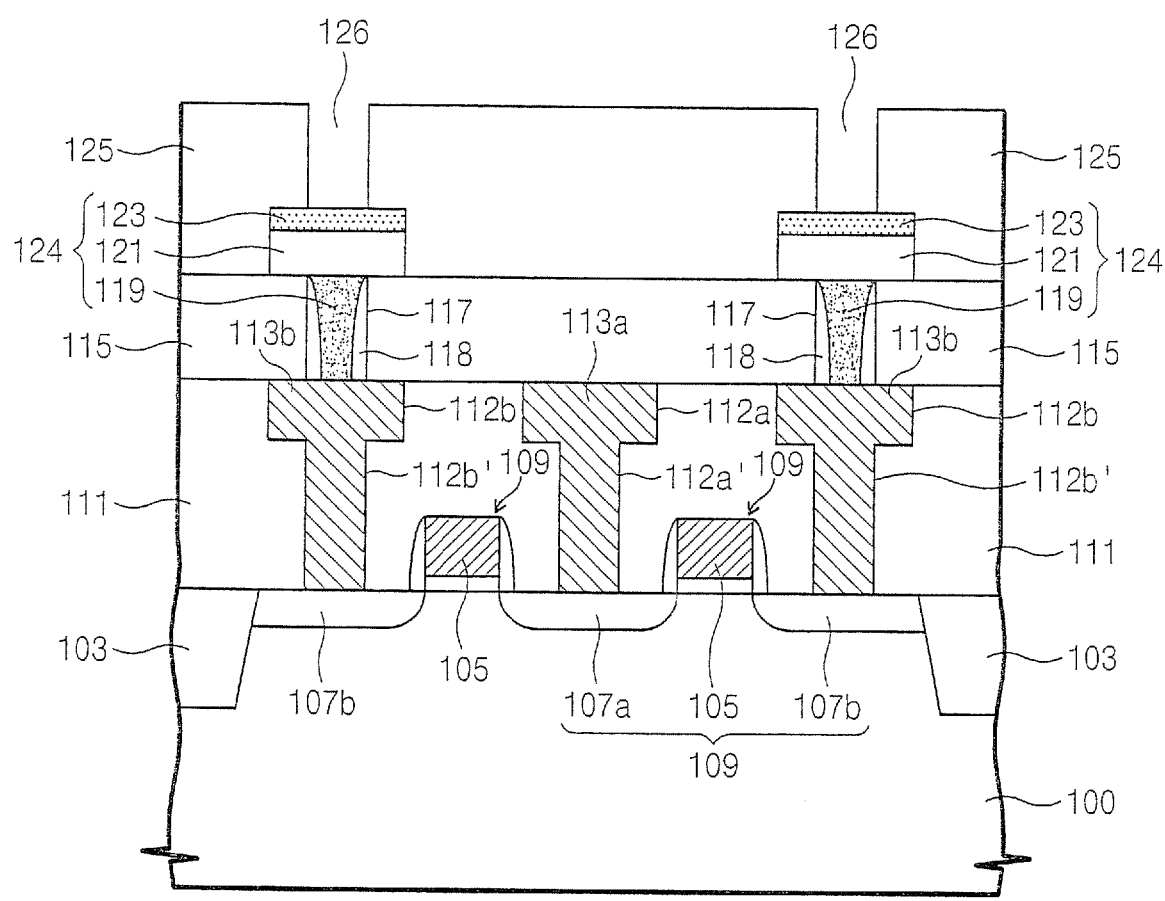

The subsequent process is for forming an upper interconnection. Referring to FIG. 9G, an upper intermetal dielectric layer 125 is formed to cover the variable resistor 124 on the lower intermetal dielectric layer 115. The upper intermetal dielectric layer 125 may be a silicon oxide layer formed by chemical vapor disposition. The upper intermetal dielectric layer 125 is patterned to form a contact hole 126 exposing the second electrode 123 of the phase-changeable resistor 124.

Figure 9H:
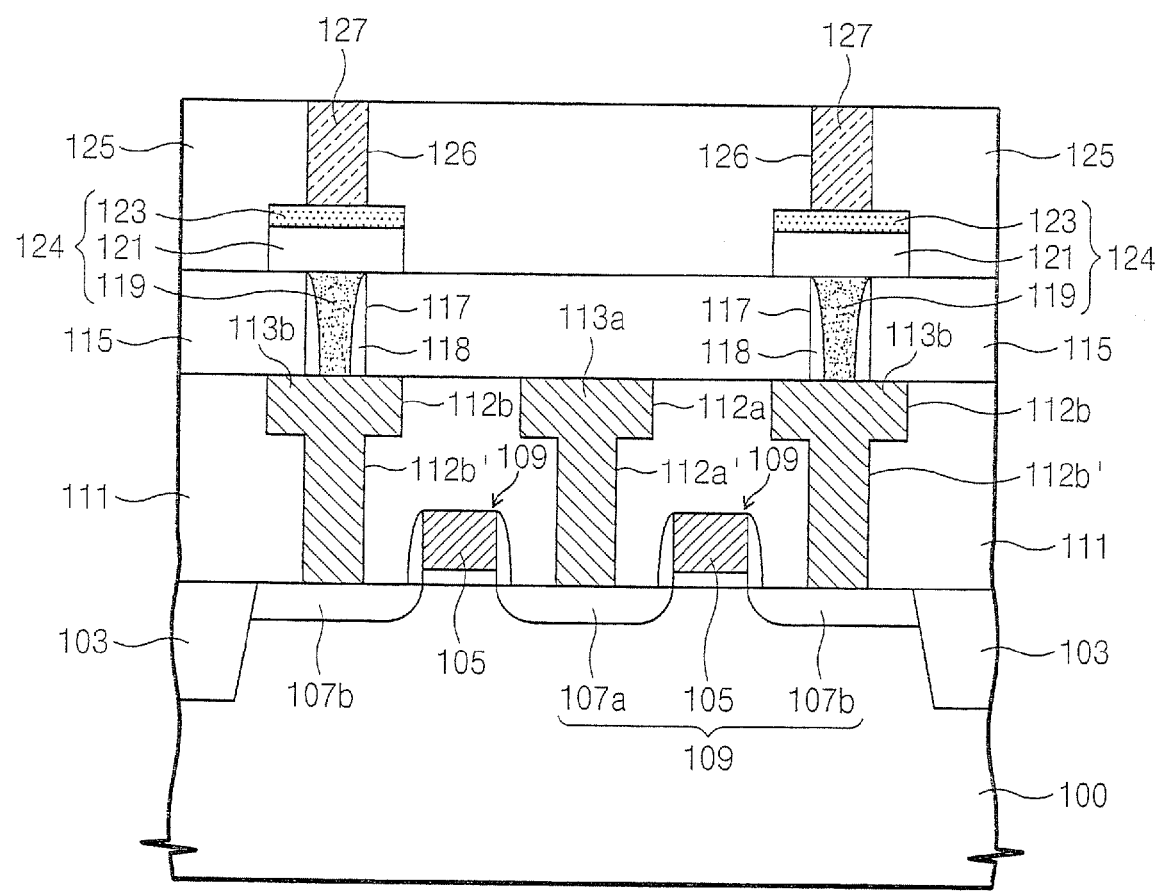

Referring to FIG. 9H, a conductive plug 127 is formed by filling conductive materials in the contact hole 126 exposing the second electrode 123. An upper interconnection material is formed on the upper intermetal dielectric layer 125 with the conductive plug 127 and then patterned to form an upper interconnection 129 electrically connected to the conductive plug 127 as illustrated in FIG. 7. As a result, the conductive plug 127 connects the second electrode 123 and the upper interconnection 129 electrically. The conductive plug 127 may be formed by depositing conductive material to substantially fill the contact hole 126 exposing the second electrode 123 and planarizing the deposited conductive material.

The conductive plug 127 may be formed of aluminum Al, aluminum copper alloy Al—Cu, aluminum copper silicon alloy Al—Cu—Si, tungsten silicide WSi, titanium Ti, tungsten W, molybdenum Mo, tantalum Ta, titanium tungsten TiW, copper Cu, etc. by physical vapor deposition, chemical vapor deposition, etc. The upper interconnection 129 may also be formed of the same material as the conductive plug 127.

Alternatively, the conductive plug and the upper interconnection may be formed in a single process, that is, the contact hole 126 exposing the second electrode 123 is formed and then a conductive material layer is formed on the contact hole 126 and the upper intermetal dielectric layer 125. The conductive material layer is then patterned, thereby forming an upper interconnection electrically connected to the second electrode 123.

Figure 10A:
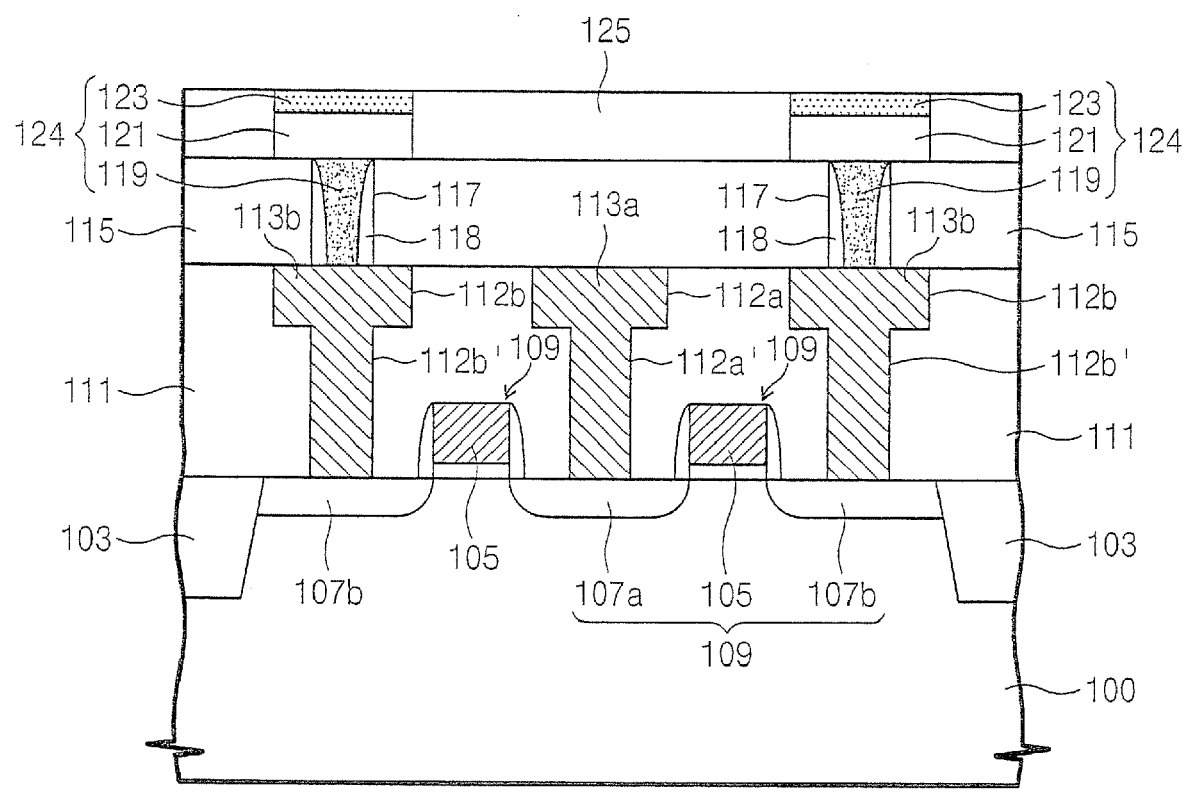
FIG. 10A through 10B are cross-sectional views illustrating methods of forming phase-changeable memory devices incorporating the variable resistor of FIG. 5.
Figure 10B:
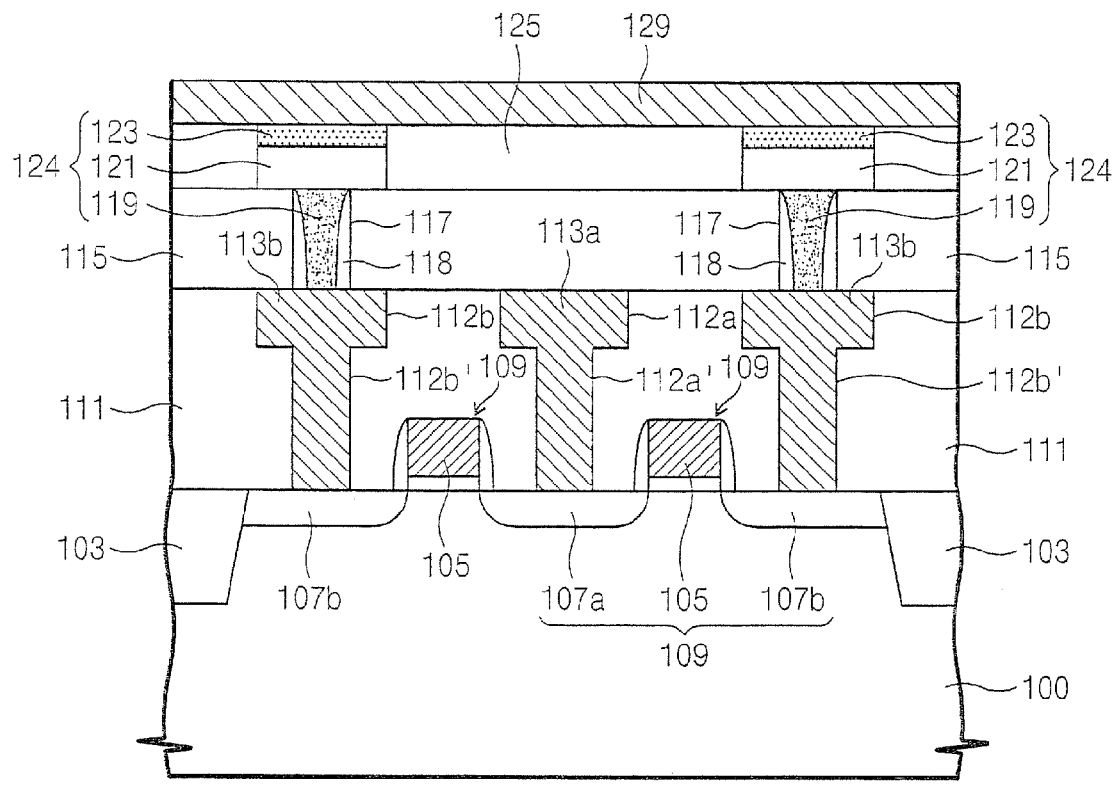

FIGS. 10A and 10B are cross-sectional views illustrating an electric connection method between the upper interconnection and the second electrode. In the embodiments of the present invention illustrated in FIGS. 10A and 10B, the contact-hole process for exposing the second electrode is omitted and the second electrode directly connects the upper interconnection.

Referring to FIG. 10A, a variable resistor 124 is formed as shown in FIG. 9F and then an upper intermetal dielectric layer 125 is formed. A planarization process is applied to the upper intermetal dielectric layer 125. The intermetal dielectric layer 125 is planarized to substantially the same height as the second electrode 123 as illustrated in FIG. 10A. The planarization process may be performed using chemical mechanical polishing (CMP) or an etch back process.

Referring to FIG. 10b, a conductive material layer is formed on the upper intermetal dielectric layer 125 and the second electrode 123 and then patterned to form an upper interconnection 129. The upper interconnection 129 may be formed of aluminum Al, aluminum-copper alloy Al—Cu, aluminum-copper-silicon alloy Al—Cu—Si, tungsten silicide WSi, titanium Ti, tungsten W, molybdenum Mo, tantalum Ta, titanium tungsten TiW, copper Cu, etc. by physical vapor deposition, chemical vapor deposition, etc. The upper interconnection 129 directly contacts with the second electrode 123.

Figure 11:
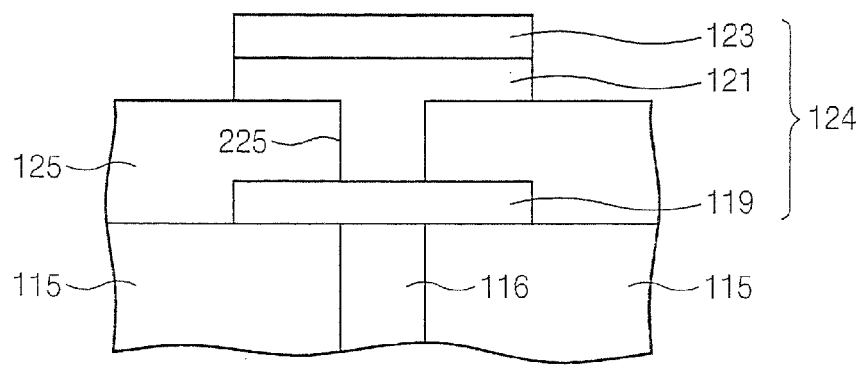
FIG. 11 is a schematic cross-sectional view illustrating a variable resistor according to further embodiments of the present invention.

FIG. 11 is a schematic cross-sectional view showing a variable resistor according to further embodiments of the present invention. The structure of FIG. 11 differs from the structure shown in FIGS. 5 and 6 in that the phase-changeable material pattern 121 is connected to the first electrode 119 through a contact hole 225 formed in a specific region of the dielectric layer 125. In addition, the first electrode 119 formed on the dielectric layer 115 does not have a contact-plug-shape but has a substantially uniform shape.

Specifically, a first electrode 119 is provided on the lower intermetal dielectric layer 115. The first electrode 119 is electrically connected to a semiconductor substrate through a contact plug 116 penetrating the lower intermetal dielectric layer 115. An upper intermetal dielectric layer 125 is disposed on the lower intermetal dielectric layer 115 to cover the first electrode 119. The upper intermetal dielectric layer 125 includes a contact hole 225 exposing a portion of the first electrode 119. A phase-changeable material pattern 121 is placed on the upper intermetal dielectric layer 125. The phase-changeable pattern 121 is electrically connected to the first electrode 119 through the contact hole 225. A second electrode 123 is disposed on the phase-changeable material pattern 121. The first electrode 119, the phase-changeable material pattern 121 and the second electrode 123 provide a variable resistance 124.

The phase-changeable material pattern 121 has a polycrystalline state with a plurality of small grains, such that resistivity thereof may be high. In certain embodiments of the present invention, the phase-changeable material pattern 121 is a chalcogenide compound doped with nitrogen atoms. For example, the phase-changeable material pattern 121 may be Ge—Sb—Te—N, As—Sb—Te—N, As—Ge—Sb—Te—N, Sn—Sb—Te—N, In—Sn—Sb—Te—N, a 5A group element-Sb—Te—N, a 6A group element-Sb—Te—N, a 5A group element-Sb—Se—N and/or a 6A group element-Sb—Se—N. An amount of the nitrogen atoms may be from about 0.25 to about 25% with respect to a total number of atoms of the ingredients included in the phase-changeable material pattern.

The second electrode 123 is electrically connected to the upper interconnection in the same way as what is illustrated in FIGS. 5 and 6. That is, the second electrode 123 may either directly or through a plug, contact the upper interconnection. In addition, the first electrode 119 is electrically connected to a source region of the access transistor formed in the substrate through a contact plug 116.

Particular methods of forming a phase-changeable memory device including the resistor of FIG. 11 will be briefly explained. A field isolation region, a transistor, a lower interconnection, a contact pad, etc. are formed on the semiconductor substrate in the same manner as explained referring to FIGS. 9A through 9C. Then, a lower intermetal dielectric layer 115 is formed. The lower intermetal dielectric layer 115 is patterned to form a contact hole exposing the metal pad. The contact hole is filled with conductive material to form a contact plug 116.

A First electrode material layer is deposited on the contact plug 116 and the lower intermetal dielectric layer 115 and then patterned to form a first electrode layer 119. The first electrode 119 covers the contact plug 116. An upper intermetal dielectric layer 125 is formed on the surface of the semiconductor substrate. The tipper intermetal dielectric layer 125 is patterned to form a contact hole 225 exposing the first electrode 119. A phase-changeable material layer is formed in the contact hole 225 and on the upper intermetal dielectric layer 125. The phase-changeable material layer 121 contains nitrogen atoms. For example, the phase-changeable material layer 121 may be formed by a sputtering method targeting chalcogen compounds, using argon gas as a carrier gas and nitrogen gas. The phase-changeable material layer 121 may be formed in a temperature range of from about 100° C. to about 350° C.

After a second electrode material is formed on the phase-changeable layer, the second electrode material and the phase-changeable material layer are successively patterned to form a phase-changeable pattern 121 and the second electrode 123.

The subsequent processes are substantially the same as those described above and, therefore, need not be described further herein.

Figure 12:
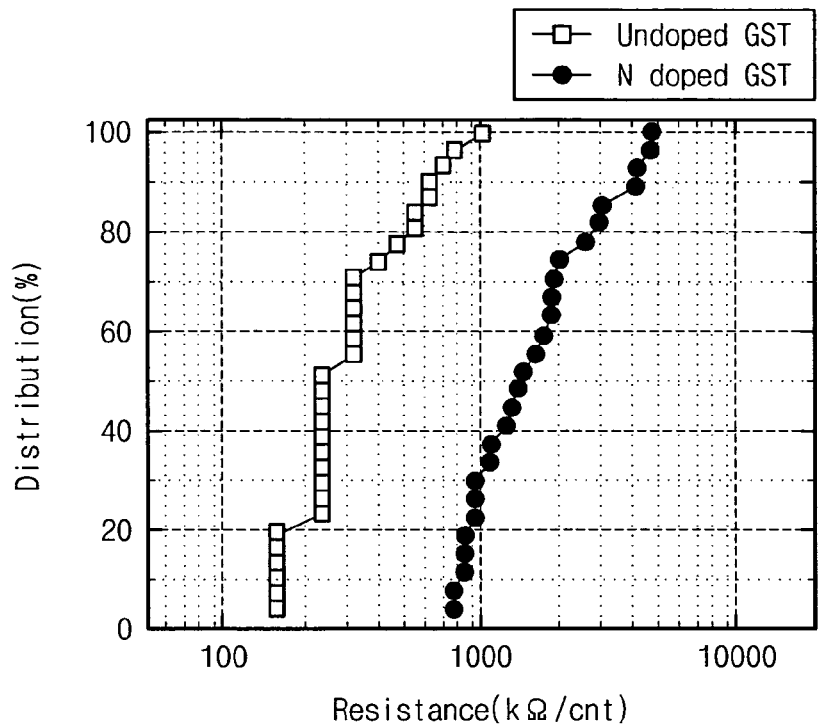
FIG. 12 is a graph showing cumulative distributions of a phase-changeable memory device according to embodiments of the present invention and a conventional phase-changeable memory device.

FIG. 12 is a graph illustrating cumulative distributions of a phase-changeable memory device according to embodiments of the present invention and a conventional phase-changeable memory device. The horizontal axis refers to resistivity (kΩ/cnt) and the vertical axis refers to a cumulative distributions. In FIG. 12, -●- represents a phase-changeable memory device including a phase-changeable material layer doped with 7% atomic percent nitrogen atoms, and -□- indicates a conventional phase-changeable memory device. The graph shows the resistance of the phase-changeable memory device according to some embodiments of the present invention increases compared to the conventional device.

Figure 13:
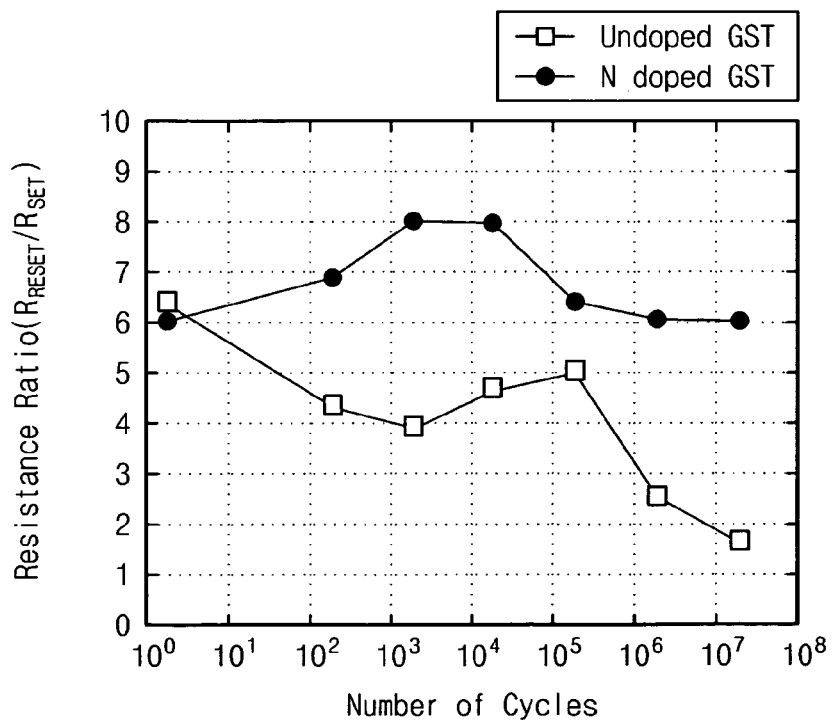
FIG. 13 is a graph showing reset/set resistances of a phase-changeable memory device having a phase-changeable material containing 7% nitrogen and a conventional phase-changeable memory device.

FIG. 13 is a graph showing reset/set resistances of a phase-changeable memory device having a phase-changeable material containing 7 atomic percent nitrogen atoms and a conventional phase-changeable memory device. In FIG. 13, the horizontal axis refers to numbers of writing operations and the vertical axis refers to reset/set resistances. In FIG. 13, -●- represents the resistance of a phase-changeable material layer doped with 7 atomic percent nitrogen atoms, and -□- represents the resistance of a conventional phase-changeable material layer. For the conventional phase-changeable memory device, the reset/set resistance decreases as the writing operation cycle is repeated. However, in case of a phase-changeable memory device according to embodiments of the present invention, the reset/set resistance ratio is about 5 or more, which is similar to the initial value despite the repeated writing operations. That is, a phase-changeable memory device according to embodiments of the present invention may have good thermal stability.

Figure 14:
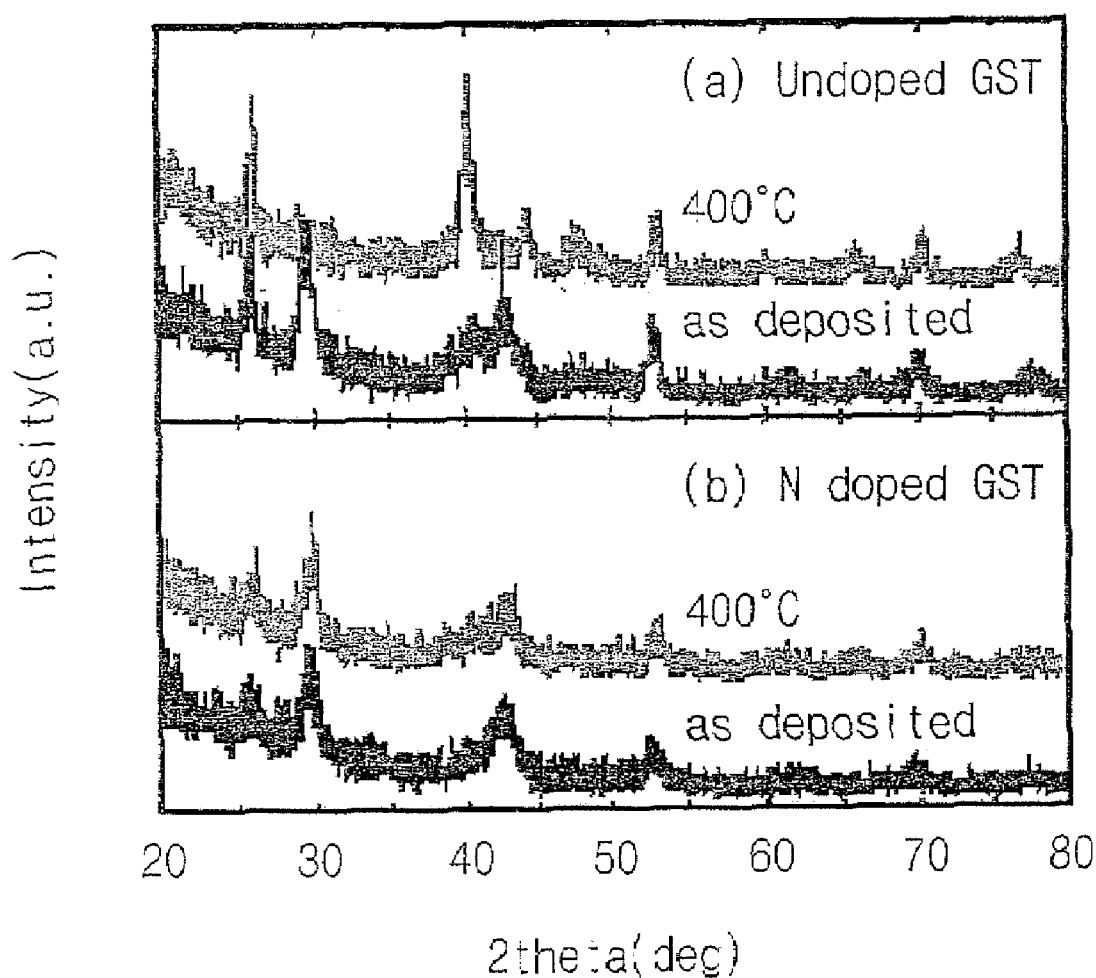
FIG. 14 is a graph showing XRD data of a phase-changeable material layer in a phase-changeable memory device according to embodiments of the present invention, containing 7% nitrogen and a conventional phase-changeable memory device.

FIG. 14 also illustrates the thermal stability of the phase-changeable memory devices according to embodiments of the present invention. FIG. 14 is a graph showing X-ray diffraction data (XRD) of a phase-changeable material layer in a phase-changeable memory device according to embodiments of the present invention, containing 7% nitrogen atoms and a conventional phase-changeable memory device. The upper graph of FIG. 14 shows intensity of the conventional phase-changeable memory device and the lower graph is of the phase-changeable memory device according to embodiments of the present invention. In the case of some embodiments of the present invention, the intensity is substantially the same before and after the 400° C. annealing but in the case of the conventional phase-changeable memory device, the intensity changes before and after the annealing.

A phase-changeable material layer using a chalcogen compound containing silicon will now be explained. In the phase-changeable memory device and method of fabricating the same discussed above with reference to nitrogen doping, silicon may replace nitrogen doped in the chalcogen compound. As an amount of silicon increases, the resistivity of the chalcogen compound increases.

Figure 15:
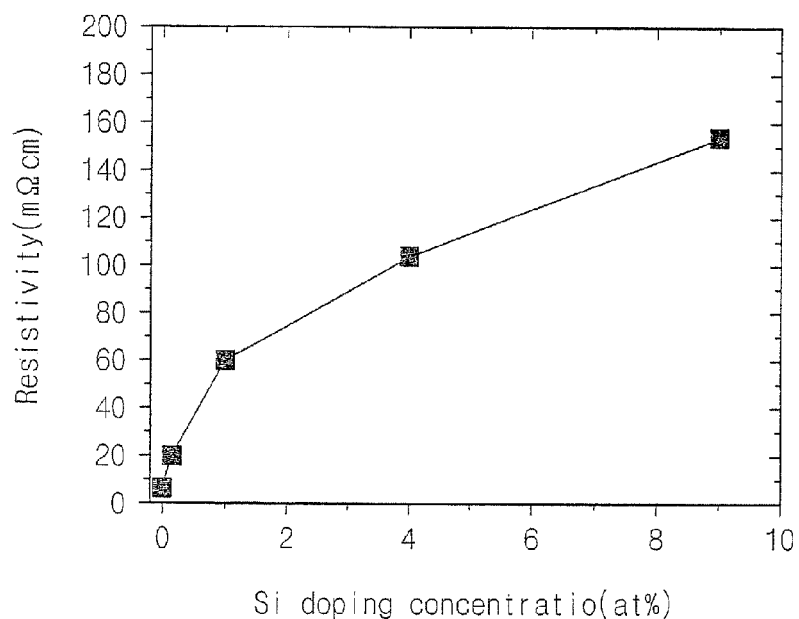
FIG. 15 is a graph showing a resistivity of silicon doped Ge—Sb—Te (Se—Sb—Te—Si) according to an amount of silicon.

FIG. 15 is a graph illustrating the resistivity of thin silicon doped GST layer according to an amount of silicon. In FIG. 15, a horizontal axis indicates an amount of doped silicon and a vertical axis indicates a resistivity (mΩ cm). The resistivity of FIG. 15 is measured after forming the GST layer containing silicon of various contents on a thin silicon dioxide layer. As illustrated in FIG. 15, the resistivity of the chalcogen compound increases according to an increase in the amount of silicon.

Referring to FIG. 15, the resistivity of $(Ge-Sb-Te)_{99.9}Si_{0.1}$ including about 0.1% silicon atoms is about 20 mΩ cm. This is increased compared to the resistivity (i.e., 7 mΩ cm) of a conventional three-element chalcogen compound (Ge—Sb—Te). It is believed that, as the content of silicon increases a size of grain in the chalcogen compound decreases gradually aid the chalcogen compound becomes closer to an amorphous state. Therefore, the resistivity of the chalcogen compound increases.

However, if the content of doped silicon is too large, the resistivity of the chalcogen compound drastically increases, which can make a power supply voltage needed for driving the phase-changeable device over 3 volts. Thus, in certain embodiments of the present invention, the contents of doped silicon may be less than about 15%.

A method of fabricating a Ge—Sb—Te—Si layer will be explained as one example of a chalcogen compound containing silicon. The chalcogen compound containing silicon is formed by a sputtering technique. That is, targeting a silicon-chalcogen compound, the sputtering is carried out using an argon gas of about 30 sccm to about 100 sccm and a nitrogen gas of about 1 sccm to about 10 sccm, in a temperature range of about 100° C. to 350° C. with a power of about 100 watts to about 2000 watts.

Figure 16:
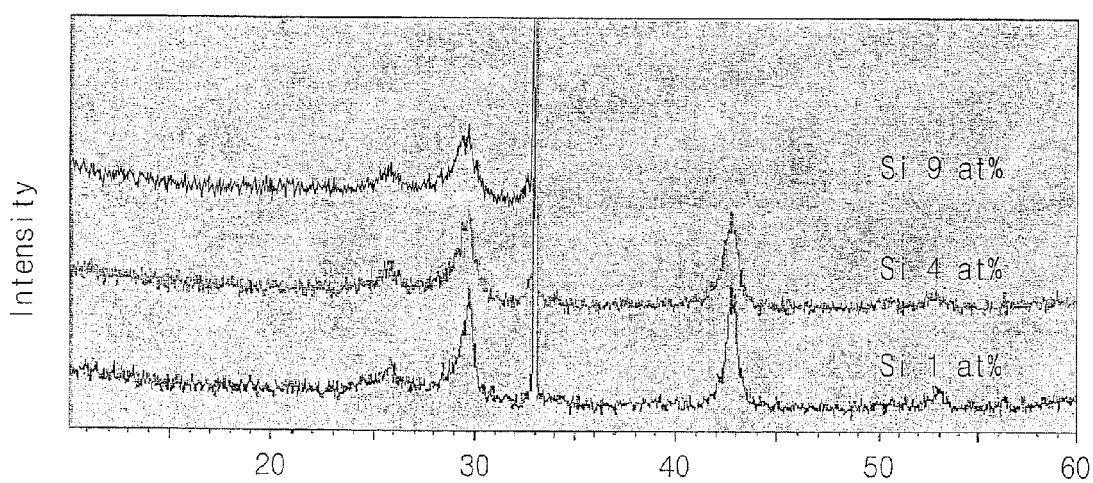
FIG. 16 is a graph showing an X-ray diffraction pattern of silicon doped GST according to a concentration of silicon.

FIG. 16 is a graph illustrating X-ray diffraction patterns of silicon doped GST layers according to a concentration of silicon. In FIG. 16, a horizontal axis indicates an incidence theta of X-ray incident upon the GST layer and a vertical axis indicates an intensity. As the concentration of doped silicon increases, a width of peak value becomes wider. This means that an amorphous state of the GST layer increases as the concentration of the doped silicon increases. That is, a size of the grain decreases and the resistivity increases as a result.

A phase-changeable material layer using a chalcogen compound containing silicon and nitrogen will now be explained. That is, a chalcogen compound may be doped with silicon atoms from about 0.1% to about 15%, and nitrogen from about 0.1% to about 20% of a total number of atoms in the composition. In particular embodiments of the present invention, the chalcogen compound contains silicon atoms from about 0.25% to about 8% and nitrogen atoms from about 0.25% to about 10% of a total number of atoms in the composition.

A method of forming a Ge—Sb—Te—Si—N layer will be explained as one example of a chalcogen compound containing silicon and nitrogen. That is, targeting a silicon-chalcogen compound (Ge—Sb—Te—Si) including silicon atoms of about 1% to 8%, the sputtering is carried out using an argon gas of about 30 sccm to about 200 sccm and a nitrogen gas of about 0.1 sccm to about 20 sccm, in a temperature range of about 100° C. to about 350° C. with a power of about 100 watts to about 2000 watts.

Figure 17:
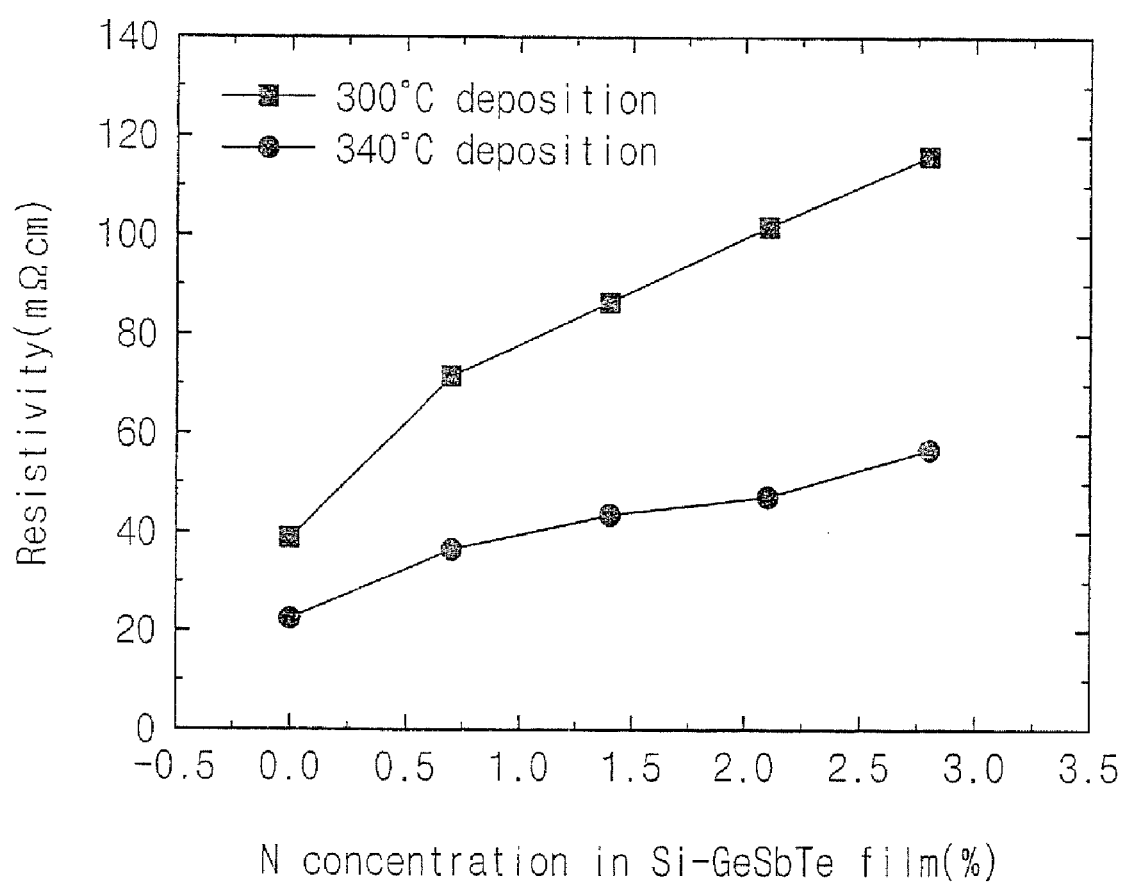
FIG. 17 is a graph showing a resistivity of silicon and nitrogen doped Ge—Sb—Te—Si—N according to a content of nitrogen.

FIG. 17 is a graph illustrating a resistivity of the Ge—Sb—Te—Si—N according to contents of nitrogen. A resistivity is measured with an increasing amount of nitrogen atoms doped into a Ge—Sb—Te layer that is doped with silicon atoms of 3%.

The resistivity of the phase-changeable material layer doped with silicon and nitrogen increases over that of the phase-changeable material layer doped with only silicon.

Figure 18:
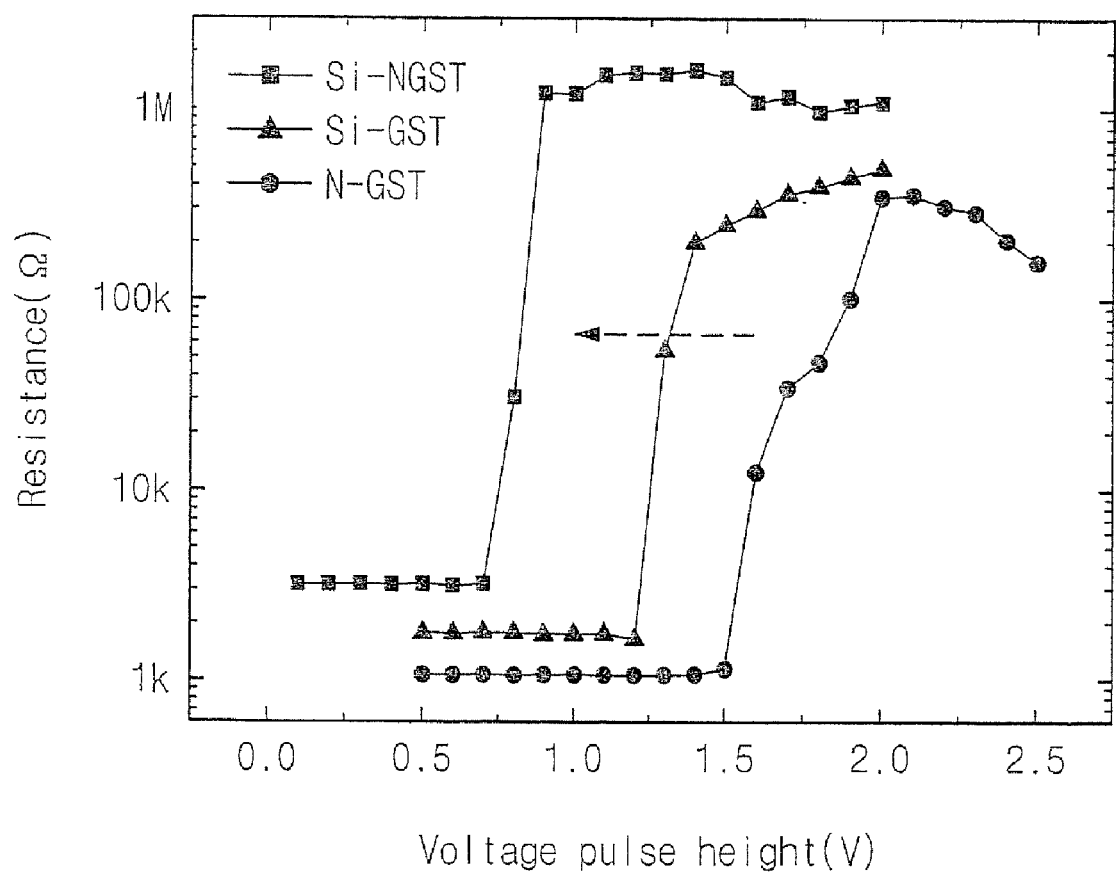
FIG. 18 is a graph showing a voltage pulse of the phase-changeable material layer according to some embodiments of the present invention.

FIG. 18 is a graph illustrating a characteristic of reset using a voltage pulse for the phase-changeable material layers according to some embodiments of the present invention. As described with reference to FIGS. 9A through 9H, after the lower electrode 117 is formed to have a diameter of 80 nm, and the phase-changeable material layer 121 to have a diameter of 680 nm and a thickness of 10 nm, a voltage pulse is applied to measure a resistance of the phase-changeable material layer. As illustrated in the drawing, when both the nitrogen and silicon are doped, the voltage pulse for conversion of the set and reset states is reduced compared to the case where only silicon is doped.

As described above, according to embodiments of the present invention, resistivity of the phase-changeable material layer can be increased over conventional phase-changeable material layers, such that the amplitude of the current pulse can be decreased during a writing operation. In addition, the resistivity of the phase-changeable material pattern can be controlled by adjusting the concentration of added nitrogen and/or silicon atoms.

A crystallization temperature of the phase-changeable material can also be raised to improve endurance. Finally, the phase-changeable material layer is provided with a polycrystalline state that includes small grains, such that diffusion distance increases over conventional phase-changeable materials. As a result, external contaminants can be reduced or even prevented from penetrating into the phase-changeable material layer.

As described above, according to embodiments of the present invention, resistivity of the phase-changeable material layer can be increased over conventional phase-changeable material layers, such that the amplitude of the current pulse can be decreased during a writing operation. In addition, the resistivity of the phase-changeable material pattern can be controlled by adjusting the concentration of added nitrogen atoms.

A crystallization temperature of the phase-changeable material can also be raised to improve endurance. Finally, the phase-changeable material layer is provided with a polycrystalline state that includes small grains, such that diffusion distance increases over conventional phase-changeable materials. As a result, exterior contaminants can be reduced or even prevented from penetrating into the phase-changeable material layer.

While the present invention has been described by way of example and in terms of the particular embodiments, it is to be understood that the invention is not limited to the disclosed embodiments. To the contrary, it is intended to cover various modifications and similar arrangements would be apparent to those skilled in the art. Therefore, the scope of the appended claims, which define the invention, should be accorded the broadest interpretation so as to encompass all such modifications and similar structures.

What is claimed is:

1. A phase-changeable memory device, comprising:
    a phase-changeable material pattern, wherein the phase-changeable material pattern includes nitrogen atoms and further comprises $A_x B_{100-x}$, wherein component A comprises tellurium, selenium, sulfur and/or polonium, and component B comprises antimony, arsenic, germanium, tin, phosphate, silver, oxygen, indium and/or bismuth and wherein $x \leq 80$ and x and 100−x are atomic percentages; and
    first and second electrodes electrically connected to the phase-changeable material pattern and providing an electrical signal thereto.

2. The device of claim 1, wherein the phase-changeable material pattern comprises $(Te_a Sb_b Ge_{100-(a+b)})_n N_{100-n}$ and $a \leq 80$, $5 \leq b \leq 50$, $75 \leq n \leq 99.75$ where a,b and 100−(a+b) are atomic percentages of the TeSbGe composition and n and 100−n are atomic percentages of the total composition.

3. A phase-changeable memory device, comprising:
    a transistor including a source region, a drain region and a gate electrode disposed on the semiconductor substrate;
    a lower interconnection electrically connected to the drain region;
    a contact pad comprising the same material and at the same height as the lower interconnection;
    a variable resistor comprising a phase-changeable material pattern electrically connected to the contact pad; and
    an upper interconnection electrically connected to the variable resistor,
    wherein the variable resistor is interposed between the two electrodes and includes silicon atoms.

4. A phase-changeable memory device, comprising:
    a transistor including a source region, a drain region and a gate electrode disposed on the semiconductor substrate;
    a lower interconnection electrically connected to the drain region;
    a contact pad comprising the same material and placed at the same height as the lower interconnection;
    a variable resistor electrically connected to the contact pad; and
    an upper interconnection electrically connected to the variable resistor, wherein the variable resistor is interposed between the two electrodes and includes nitrogen atoms and further comprises $A_xB_{100-x}$, wherein component A comprises tellurium, selenium, sulfur and/or polonium and component B comprises antimony, arsenic, germanium, tin, phosphate, silver, oxygen, indium and/or bismuth and wherein $x \leq 80$ and x and 100-x are atomic percentages with respect to the AB composition; and first and second electrodes electrically connected to the phase-changeable material pattern and providing an electrical signal thereto, the electrodes facing each other.

5. The device of claim 4, wherein the variable resistor comprises $(Te_aSb_bGe_{100-(a+b)})_nN_{100-n}$ and $a \leq 80$, $5 \leq b \leq 50$, $75 \leq n \leq 99.75$, where x and 100-x are atomic percentages with respect to the AB composition and n and 100-n are atomic percentages with respect to the total composition.

6. A memory device, comprising:
a variable resistivity material having resistivity-increasing dopants therein that comprise from about 0.1% to about 25% of a total number of atoms in the variable resistivity material; and
first and second electrodes electrically coupled to the variable resistivity material.

7. The memory device of claim 6, wherein the variable resistivity material has a polycrystalline structure.

8. The memory device of claim 6, wherein the dopants comprise silicon atoms and/or nitrogen atoms.

9. The memory device of claim 8, wherein the nitrogen atoms included in the variable resistivity material are from about 0.1% to about 20% of a total number of atoms in the variable resistivity material.

10. The memory device of claim 9, wherein the silicon atoms are from about 0.25 to about 8 atomic percent and the nitrogen atoms from about 0.25 to about 10 atomic percent of the variable resistivity material.

11. The memory device of claim 6, wherein the variable resistivity material comprises Ge—Sb—Te—Si, As—Sb—Te—Si, As—Ge—Sb—Te—Si, Sn—Sb—Te—Si, In—Sn—Sb—Te—Si, Ag—In—Sb—Te—Si, 5A group element-Sb—Te—Si, 6A group element-Sb—Te—Si, 5A group element-Sb—Se—Si, and/or 6A group element-Sb—Se—Si.

12. The memory device of claim 6, wherein the variable resistivity material comprises $(Te_aSb_bGe_{100-(a+b)})_nSi_{100-n}$, wherein $a \leq 80$, $5 \leq b \leq 50$, $85 \leq n \leq 99.9$, where a,b and 100-(a+b) are atomic percentages with respect to the TeSbGe composition and n and 100-n are atomic percentages with respect to the total composition.

13. The memory device of claim 8, wherein the variable resistivity material comprises $(Te_aSb_bGe_{100-(a+b)})_nSi_cN_{100-(n+c)}$, wherein $a \leq 80$, $5 \leq b \leq 50$, $0.1 \leq c \leq 15$, $80 \leq n \leq 99.9$, where a,b and 100-(a+b) are atomic percentages with respect to the TeSbGe composition and n, c and 100-(n+c) are atomic percentages with respect to the total composition.

14. The memory device of claim 8, wherein the variable resistivity material comprises $(Te_aSb_bGe_{100-(a+b)})_nSi_cN_{100-(n+c)}$, wherein $a \leq 80$, $5 \leq b \leq 50$, $0\ 25 \leq c \leq 8$, $90 \leq n \leq 99.75$, where a,b and 100-(a+b) are atomic percentages with respect to the TeSbGe composition and n, c and 100-(n+c) are atomic percentages with respect to the total composition.

15. The memory device of claim 6, wherein the variable resistivity material comprises $A_xB_{100-x}$, wherein component A is tellurium, selenium, sulfur, and/or polonium and component B is antimony, arsenic, germanium, tin, phosphorus, silver, oxygen, indium and/or bismuth and wherein $x \leq 80$ and x and 100-x are atomic percentages.

16. The memory device of claim 15, wherein the variable resistivity material comprises $(A_xB_{100-x})_nSi_{100-n}$, wherein $x \leq 80$, $85 \leq n \leq 99.9$, where x and 100-x are atomic percentages with respect to the AB composition and n and 100-n are atomic percentages with respect to the total composition.

17. The memory device of claim 15, wherein the variable resistivity material comprises $(A_xB_{100-x})_nSi_cN_{100-(n+c)}$, wherein $x \leq 80$, $65 \leq n \leq 99.8$, $80 \leq n+c \leq 99.9$, $0.1 \leq c \leq 15$, where x and 100-x are atomic percentages with respect to the AB composition and n, c and 100-(n+c) are atomic percentages with respect to the total composition.

18. A memory device, comprising:
a variable resistivity material, wherein the variable resistivity material includes nitrogen atoms and further comprises $A_xB_{100-x}$, wherein component A comprises tellurium, selenium, sulfur and/or polonium, and component B comprises antimony, arsenic, germanium, tin, phosphorus, silver, oxygen, indium and/or bismuth and wherein $x \leq 80$ and x and 100-x are atomic percentages; and
first and second electrodes electrically coupled to the variable resistivity material.

19. The memory device of claim 18, wherein the variable resistivity material comprises $(Te_aSb_bGe_{100-(a+b)})_nN_{100-n}$ and $a \leq 80$, $5 \leq b \leq 50$, $75 \leq n \leq 99.75$ where a,b and 100-(a+b) are atomic percentages of the TeSbGe composition and n and 100-n are atomic percentages of the total composition.

20. A memory cell, comprising:
a variable resistivity material doped with resistivity-increasing dopants to a level in a range from about 0.1% to about 15% by atomic percentage; and
first and second electrodes electrically coupled to the variable resistivity material.

21. The memory cell of claim 20, wherein the resistivity-increasing dopants include nitrogen.

22. The memory cell of claim 21, wherein the resistivity-increasing dopants include silicon.

* * * * *

UNITED STATES PATENT AND TRADEMARK OFFICE
CERTIFICATE OF CORRECTION

PATENT NO. : 7,462,900 B2  Page 1 of 1
APPLICATION NO. : 12/039156
DATED : December 9, 2008
INVENTOR(S) : Hideki et al.

It is certified that error appears in the above-identified patent and that said Letters Patent is hereby corrected as shown below:

On the Title Page:
Item 30, Foreign Application Priority Data:
  Please add -- February 24, 2003  (KR)  .......10-2003-11416 --

Item 57, Abstract, Line 8:
  Please correct "polycrystal line" to read -- polycrystalline --

Column 22, Claim 14, Line 6: Please correct "0 25"
  To read -- 0.25 --

Signed and Sealed this

Seventeenth Day of February, 2009

JOHN DOLL
*Acting Director of the United States Patent and Trademark Office*